US012588253B2

(12) United States Patent
Ogawa

(10) Patent No.: US 12,588,253 B2
(45) Date of Patent: Mar. 24, 2026

(54) SEMICONDUCTOR DEVICE AND METHOD OF MANUFACTURING THE SAME

(71) Applicant: ROHM CO., LTD., Ukyo-ku (JP)

(72) Inventor: Shogo Ogawa, Ukyo-ku (JP)

(73) Assignee: ROHM CO., LTD., Kyoto (JP)

( * ) Notice: Subject to any disclaimer, the term of this patent is extended or adjusted under 35 U.S.C. 154(b) by 899 days.

(21) Appl. No.: 17/818,173

(22) Filed: Aug. 8, 2022

(65) Prior Publication Data

US 2023/0058820 A1      Feb. 23, 2023

(30) Foreign Application Priority Data

Aug. 20, 2021      (JP) ................................. 2021-135193

(51) Int. Cl.
*H10D 62/10* (2025.01)
*H10D 30/01* (2025.01)
*H10D 30/66* (2025.01)
*H10D 62/17* (2025.01)

(52) U.S. Cl.
CPC ....... *H10D 62/107* (2025.01); *H10D 30/0297* (2025.01); *H10D 30/668* (2025.01); *H10D 62/393* (2025.01)

(58) Field of Classification Search
CPC .. H10D 62/107; H10D 62/393; H10D 30/668; H10D 30/0297
USPC ....................................................... 257/330
See application file for complete search history.

(56) References Cited

U.S. PATENT DOCUMENTS

| | | | | |
|---|---|---|---|---|
| 2010/0176447 A1* | 7/2010 | Takaishi | ............... | H10D 30/635 257/334 |
| 2014/0175508 A1* | 6/2014 | Suzuki | .................... | H10D 8/60 257/140 |
| 2015/0069504 A1* | 3/2015 | Nozu | .................. | H10D 64/516 257/331 |

(Continued)

FOREIGN PATENT DOCUMENTS

| | | |
|---|---|---|
| JP | 2008300494 A | 12/2008 |
| JP | 2014127555 A | 7/2014 |

(Continued)

OTHER PUBLICATIONS

Notice of Reasons for Refusal issued in Japanese Patent Application No. 2021-135193, mailed May 29, 2025, with machine translation.

(Continued)

*Primary Examiner* — Igwe U Anya
(74) *Attorney, Agent, or Firm* — HSML P.C.

(57) ABSTRACT

There is provided a semiconductor device including: an n-type semiconductor substrate having a first main surface and a second main surface on an opposite side of the first main surface; an n-type semiconductor layer arranged on the first main surface of the semiconductor substrate; a pair of trenches formed at a distance from each other on a surface of the semiconductor layer on an opposite side of the semiconductor substrate; a pair of gate electrodes buried in the pair of trenches; a gate insulating film interposed between the gate electrodes and the semiconductor layer; a source electrode formed on the surface of the semiconductor layer on the opposite side of the semiconductor substrate; and a drain electrode formed on the second main surface of the semiconductor substrate.

8 Claims, 20 Drawing Sheets

(56)     References Cited

U.S. PATENT DOCUMENTS

| 2021/0288156 | A1* | 9/2021 | Fukui ..................... H10D 64/64 |
|---|---|---|---|
| 2021/0305369 | A1* | 9/2021 | Nakano ................ H10D 12/481 |
| 2023/0036221 | A1* | 2/2023 | Hino .................. H10D 30/0297 |
| 2023/0282741 | A1* | 9/2023 | Kawahara .............. H10D 64/64 |
| 2023/0290874 | A1* | 9/2023 | Yoshida .............. H10D 62/106 |

FOREIGN PATENT DOCUMENTS

| JP | 2015056492 | A | 3/2015 |
|---|---|---|---|
| JP | 2016015439 | A | 1/2016 |
| JP | 2020042892 | A | 3/2020 |
| WO | 2018225600 | A1 | 12/2018 |

OTHER PUBLICATIONS

Notice of Reasons for Refusal issued in Japanese Application No. 2021-135193, dated Oct. 9, 2025, with English translation.

\* cited by examiner

SEMICONDUCTOR DEVICE AND METHOD OF MANUFACTURING THE SAME

CROSS-REFERENCE TO RELATED APPLICATION(S)

This application is based upon and claims the benefit of priority from Japanese Patent Application No. 2021-135193, filed on Aug. 20, 2021, the entire contents of which are incorporated herein by reference.

TECHNICAL FIELD

The present disclosure relates to a semiconductor device and a method of manufacturing the same.

BACKGROUND

A single-conductive transistor in which a semiconductor substrate and a semiconductor layer formed on the semiconductor substrate are of the same conductive type has been developed. In an n-type single-conductive transistor, if a high voltage is continuously applied between the drain-source electrodes, a withstand voltage reduction phenomenon such as a sudden current flowing between the drain-source electrodes may occur.

The reason for this is that when a high voltage is applied between the drain-source electrodes, holes and electrons are generated in an n-type semiconductor layer. The electrons generated in the n-type semiconductor layer flow to the drain electrode via the n-type semiconductor layer. On the other hand, the holes generated in the n-type semiconductor layer move to the vicinity of the source electrode. However, since the source electrode is in ohmic contact with the n-type semiconductor layer, a barrier that hinders the movement of the holes from the n-type semiconductor layer to the source electrode exists at an interface between the source electrode and the n-type semiconductor layer. As a result, the holes cannot move to the source electrode, so that the holes are accumulated in the n-type semiconductor layer. As the holes are accumulated in the n-type semiconductor layer, a barrier to electrons at the interface between the source electrode and the n-type semiconductor layer becomes lower. As a result, the withstand voltage reduction phenomenon occurs in which a current suddenly flows from the drain electrode to the source electrode.

SUMMARY

Some embodiments of the present disclosure provide a semiconductor device capable of suppressing the occurrence of a withstand voltage reduction phenomenon such as a sudden current flowing between drain and source electrodes, and a method of manufacturing the same.

According to one embodiment of the present disclosure, there is provided a semiconductor device including: an n-type semiconductor substrate having a first main surface and a second main surface on an opposite side of the first main surface; an n-type semiconductor layer arranged on the first main surface of the semiconductor substrate; a pair of trenches formed at a distance from each other on a surface of the semiconductor layer on an opposite side of the semiconductor substrate; a pair of gate electrodes buried in the pair of trenches; a gate insulating film interposed between the gate electrodes and the semiconductor layer; a source electrode formed on the surface of the semiconductor layer on the opposite side of the semiconductor substrate;

and a drain electrode formed on the second main surface of the semiconductor substrate, wherein the source electrode includes a first electrode that makes Schottky contact with a first region, which is a portion of an inter region of the pair of gate electrodes in the surface of the semiconductor layer, and a second electrode that makes ohmic contact with a second region different from the first region in the inter region.

With this configuration, it is possible to suppress the occurrence of a withstand voltage reduction phenomenon such as a sudden current flowing between the drain and source electrodes.

In one embodiment of the present disclosure, there is provided a semiconductor device including: an n-type semiconductor substrate having a first main surface and a second main surface on an opposite side of the first main surface; an n-type semiconductor layer arranged on the first main surface of the semiconductor substrate; a pair of trenches formed at a distance from each other on a surface of the semiconductor layer on an opposite side of the semiconductor substrate; a pair of gate electrodes buried in the pair of trenches; a gate insulating film interposed between the gate electrodes and the semiconductor layer; a source electrode formed on the surface of the semiconductor layer on the opposite side of the semiconductor substrate; and a drain electrode formed on the second main surface of the semiconductor substrate, wherein the gate electrodes are composed of an n-type semiconductor, and wherein the gate insulating film is composed of AN or SiN.

With this configuration, it is possible to suppress the occurrence of a withstand voltage reduction phenomenon such as a sudden current flowing between the drain and source electrodes.

In one embodiment of the present disclosure, there is provided a method of manufacturing a semiconductor device, including: forming an n-type semiconductor layer on an n-type semiconductor substrate; forming a pair of trenches at a distance from each other on a surface of the semiconductor layer on an opposite side of the semiconductor substrate; burying a pair of gate electrodes in the pair of trenches via a gate insulating film; forming a source electrode on the surface of the semiconductor layer on the opposite side of the semiconductor substrate; and forming a drain electrode on a main surface of the semiconductor substrate, wherein the forming the source electrode includes: forming a first electrode that makes Schottky contact with a first region, which is a portion of an inter region of the pair of gate electrodes in the surface of the semiconductor layer; and forming a second electrode that makes ohmic contact with a second region different from the first region in the inter region.

With this manufacturing method, it is possible to obtain a semiconductor device capable of suppressing the occurrence of a withstand voltage reduction phenomenon such as a sudden current flowing between the drain and source electrodes.

BRIEF DESCRIPTION OF DRAWINGS

The accompanying drawings, which are incorporated in and constitute a part of the specification, illustrate embodiments of the present disclosure.

FIG. 4A is a cross-sectional view showing an example of a manufacturing process of a nitride semiconductor device of FIG. 1, which corresponds to the cut section of FIG. 2.

FIG. 4B is a cross-sectional view showing a next step of FIG. 4A.

DETAILED DESCRIPTION

Figure 1:
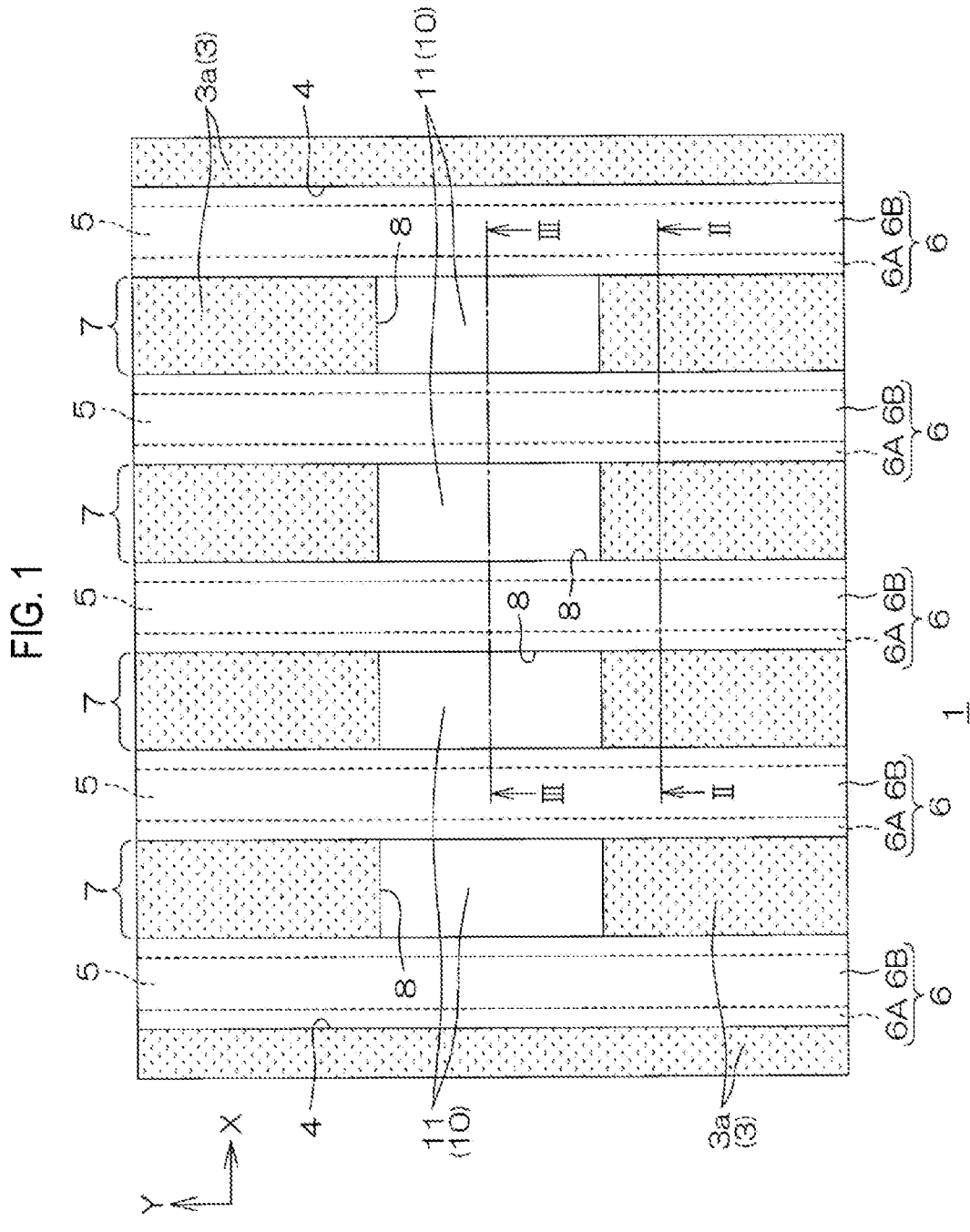
FIG. 1 is a schematic plan view of a semiconductor device according to a first embodiment of the present disclosure.

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

DESCRIPTION OF EMBODIMENTS OF THE PRESENT DISCLOSURE

According to one embodiment of the present disclosure, there is provided a semiconductor device including: an n-type semiconductor substrate having a first main surface and a second main surface on an opposite side of the first main surface; an n-type semiconductor layer arranged on the first main surface of the semiconductor substrate; a pair of trenches formed at a distance from each other on a surface of the semiconductor layer on an opposite side of the semiconductor substrate; a pair of gate electrodes buried in the pair of trenches; a gate insulating film interposed between the gate electrodes and the semiconductor layer; a source electrode formed on the surface of the semiconductor layer on the opposite side of the semiconductor substrate; and a drain electrode formed on the second main surface of the semiconductor substrate, wherein the source electrode includes a first electrode that makes Schottky contact with a first region, which is a portion of an inter region of the pair of gate electrodes in the surface of the semiconductor layer, and a second electrode that makes ohmic contact with a second region different from the first region in the inter region.

With this configuration, it is possible to suppress the occurrence of a withstand voltage reduction phenomenon such as a sudden current flowing between the drain and source electrodes.

In one embodiment of the present disclosure, a recess is selectively formed in the inter region, and the first electrode is buried in the recess.

In one embodiment of the present disclosure, a depth position of a lower end of the first electrode is deeper than a depth position of upper surfaces of the gate electrodes and is shallower than a depth position of lower surfaces of the gate electrodes.

In one embodiment of the present disclosure, a depth position of a lower end of the first electrode is deeper than a depth position of upper surfaces of the gate electrodes and is shallower than a central depth position of the gate electrodes in a vertical direction.

In one embodiment of the present disclosure, a high concentration region having a higher n-type impurity concentration than an n-type impurity concentration in other regions of the semiconductor layer is formed on a surface layer portion of the semiconductor layer immediately below the second electrode.

In one embodiment of the present disclosure, the n-type impurity concentration in the high concentration region is $1 \times 10^{17}$ cm$^{-3}$ to $1 \times 10^{21}$ cm$^{-3}$, and the n-type impurity concentration in regions other than the high concentration region in the semiconductor layer is $1 \times 10^{15}$ cm$^{-3}$ to $1 \times 10^{18}$ cm$^{-3}$.

In one embodiment of the present disclosure, the second electrode is composed of a laminated film of a Ti film formed on the semiconductor layer and an Au film formed on the Ti film, or a Ti single film.

In one embodiment of the present disclosure, the first electrode is composed of a Ni film, a Pt film, a TiN film, a Mo film, or a Pb film.

According to another embodiment of the present disclosure, there is provided a semiconductor device including: an n-type semiconductor substrate having a first main surface and a second main surface on an opposite side of the first main surface; an n-type semiconductor layer arranged on the first main surface of the semiconductor substrate; a pair of trenches formed at a distance from each other on a surface of the semiconductor layer on an opposite side of the semiconductor substrate; a pair of gate electrodes buried in the pair of trenches; a gate insulating film interposed between the gate electrodes and the semiconductor layer; a source electrode formed on the surface of the semiconductor layer on the opposite side of the semiconductor substrate; and a drain electrode formed on the second main surface of the semiconductor substrate, wherein the gate electrodes are composed of an n-type semiconductor, and wherein the gate insulating film is composed of AN or SiN.

With this configuration, it is possible to suppress the occurrence of a withstand voltage reduction phenomenon such as a sudden current flowing between the drain and source electrodes.

In one embodiment of the present disclosure, the gate electrodes are composed of n-type polysilicon.

In one embodiment of the present disclosure, the semiconductor substrate is a Si substrate, a SiC substrate, a GaN substrate, or a $Ga_2O_3$ substrate.

In one embodiment of the present disclosure, the semiconductor layer is a $Ga_2O_3$ layer or a ZnO layer.

According to another embodiment of the present disclosure, there is provided a method of manufacturing a semiconductor device, including: forming an n-type semiconductor layer on an n-type semiconductor substrate; forming a pair of trenches at a distance from each other on a surface of the semiconductor layer on an opposite side of the semiconductor substrate; burying a pair of gate electrodes in the pair of trenches via a gate insulating film; forming a source electrode on the surface of the semiconductor layer on the opposite side of the semiconductor substrate; and forming a drain electrode on a main surface of the semiconductor substrate, wherein the forming the source electrode includes: forming a first electrode that makes Schottky contact with a first region, which is a portion of an inter region of the pair of gate electrodes in the surface of the semiconductor layer; and forming a second electrode that makes ohmic contact with a second region different from the first region in the inter region.

With this manufacturing method, it is possible to obtain a semiconductor device capable of suppressing the occurrence of a withstand voltage reduction phenomenon such as a sudden current flowing between the drain and source electrodes.

In one embodiment of the present disclosure, the forming the first electrode includes: selectively forming a recess in the inter region; and burying the first electrode in the recess.

Detailed Description of Embodiments of the Present Disclosure

Hereinafter, embodiments of the present disclosure will be described in detail with reference to the accompanying drawings.

Figure 2:
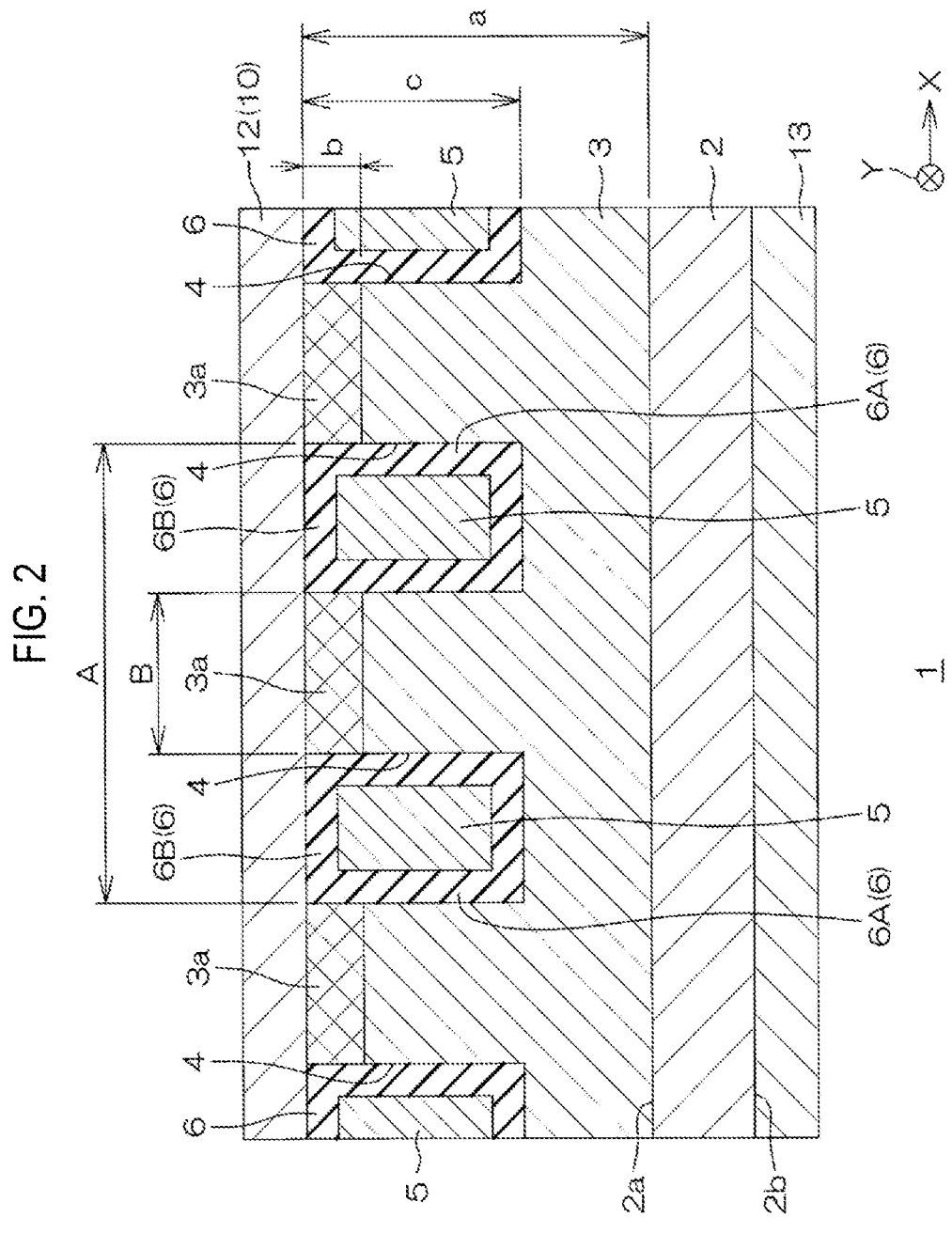
FIG. 2 is a cross-sectional view taken along line II-II of FIG. 1.
Figure 3:
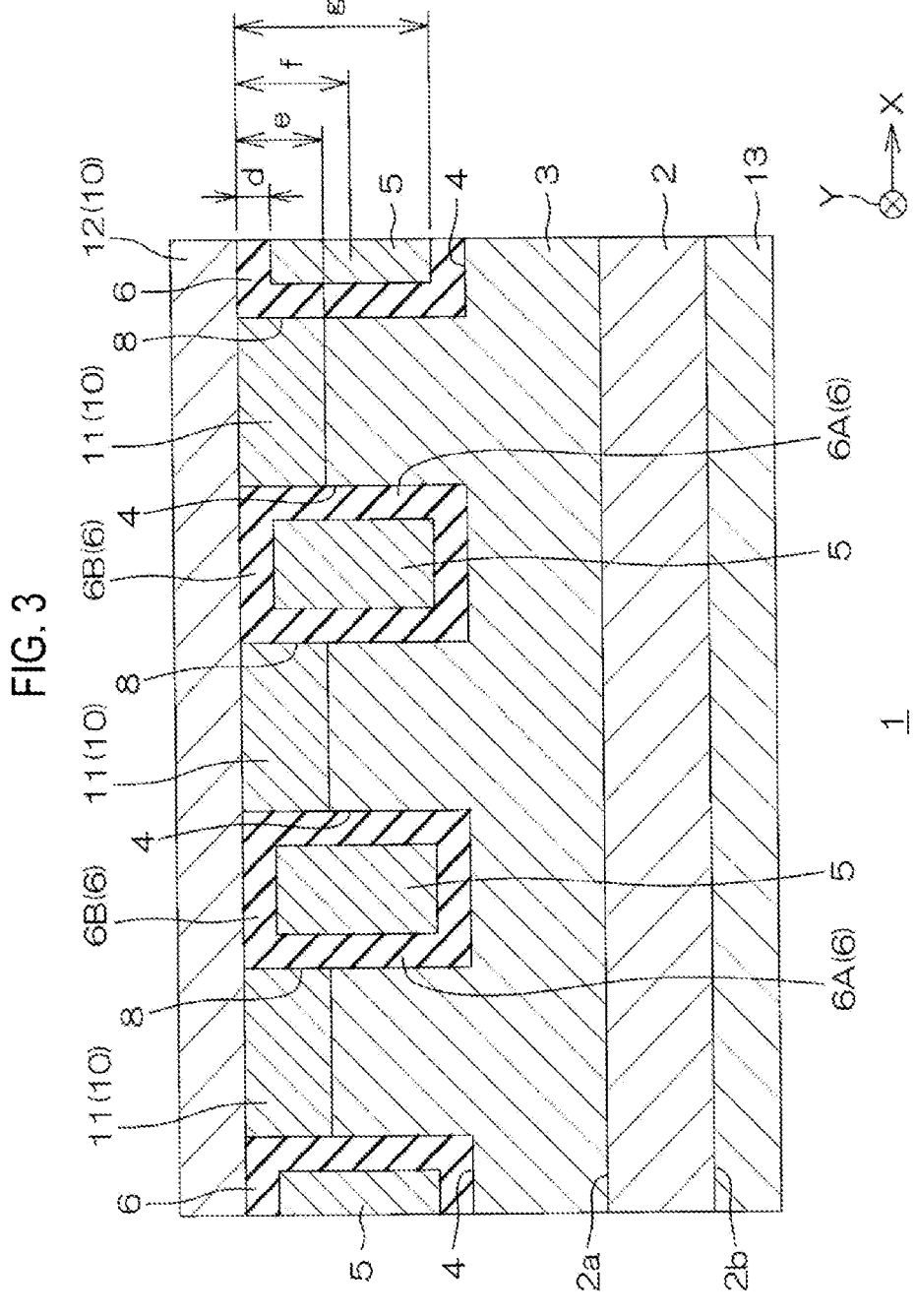
FIG. 3 is a cross-sectional view taken along line III-III of FIG. 1.

FIG. 1 is a schematic plan view of a semiconductor device according to a first embodiment of the present disclosure. FIG. 2 is a cross-sectional view taken along line II-II of FIG. 1. FIG. 3 is a cross-sectional view taken along line III-III of FIG. 1. In FIG. 1, the configuration above the surface of a semiconductor layer 3 is omitted. For the sake of convenience of explanation, X and Y directions shown in FIGS. 1 to 3 may be used below. The X direction is a predetermined direction along the surface of a semiconductor substrate 2 in a plan view, and the Y direction is a direction along the surface of the semiconductor substrate 2 in a plan view and is a direction orthogonal to the X direction. The same applies to FIGS. 6 to 11.

The semiconductor device 1 is a single-conduction type transistor of an n-type and is a vertical MOSFET (Metal Oxide Semiconductor Field Effect Transistor). The semiconductor device 1 includes a semiconductor substrate 2 having a first main surface 2a and a second main surface 2b on the opposite side thereof, and a semiconductor layer 3 formed on the first main surface 2a of the semiconductor substrate 2. The conductive type of the semiconductor substrate 2 and the semiconductor layer 3 is n type. The first main surface 2a has a square shape having two sides parallel to the X direction and two sides parallel to the Y direction in a plan view.

The semiconductor substrate 2 is formed of a Si substrate in this embodiment. The semiconductor substrate 2 may be a SiC substrate, a GaN substrate, a $Ga_2O_3$ substrate, or the like. The resistivity of the semiconductor substrate 2 is about 0.001 Ωmm to 0.5 Ωmm. The concentration of n-type impurities in the semiconductor layer 3 is preferably $1 \times 10^{15}$ $cm^{-3}$ or more and $1 \times 10^{18}$ $cm^{-3}$ or less. In this embodiment, the semiconductor layer 3 is formed of an oxide semiconductor such as $Ga_2O_3$ or ZnO. In this embodiment, the semiconductor layer 3 is formed of a $Ga_2O_3$ layer. The film thickness of the semiconductor layer 3 is about 0.5 μm to 5 μm. In this embodiment, the film thickness of the semiconductor layer 3 is about 3 μm. The semiconductor layer 3 functions as a drain region (drift layer) of a field-effect transistor.

A plurality of trenches 4 formed at intervals in the X direction and extending in the Y direction are formed on the surface (upper surface) of the semiconductor layer 3 on the side opposite to the semiconductor substrate 2. That is, the plurality of trenches 4 are formed in a striped shape. The trenches 4 extend from the upper surface of the semiconductor layer 3 to the thickness intermediate portion of the semiconductor layer 3. Assuming that a distance between the outer surfaces (periodic structure width) of two trenches 4 adjacent to each other is A (see FIG. 2), a distance B between the inner surfaces of the two trenches 4 adjacent to each other (interval between the trenches 4) is preferably $A/4 < B < 3A/4$, more preferably $B = A/2$. A is about 100 nm to 2,000 nm. B is about 10 nm to 200 nm. The depth of the trench 4 will be described later.

A gate electrode 5 is buried in each trench 4. A gate insulating film 6 is interposed between the gate electrode 5 and the semiconductor layer 3. In this embodiment, the gate insulating film 6 is formed on the side surface and the bottom surface of the trench 4 and includes a first gate insulating film 6A covering the side surface and the bottom surface of the gate electrode 5, and a second gate insulating film 6B covering the upper surface of the gate electrode 5. In this embodiment, the upper surface of the second gate insulating film 6B and the upper surface of the semiconductor layer 3 are substantially flush with each other.

The gate electrode 5 may be p-type polysilicon or n-type polysilicon. In that case, the p-type impurity concentration or the n-type impurity concentration is preferably $1 \times 10^{18}$ $cm^{-3}$ or more and $1 \times 10^{21}$ $cm^{-3}$ or less. The gate electrode 5 may be composed of another semiconductor or metal. The gate insulating film 6 is formed of, for example, an $Al_2O_3$ film. The gate insulating film 6 may be composed of a $SiO_2$ film. The film thickness of the gate insulating film 6 is about 5 nm to 30 nm.

A recess 8 is selectively formed in a region between adjacent gate electrodes 5 on the upper surface of the semiconductor layer 3 (more precisely, a region 7 between gate insulating films 6 covering the adjacent gate electrodes 5). In this embodiment, the recess 8 is formed in the length intermediate portion (intermediate portion in the Y direction) of the inter-region 7. The width (length in the X direction) of the recess 8 is equal to the width of the inter-region 7, and both side surfaces of the recess 8 are formed by the gate insulating film 6 covering the adjacent gate electrodes 5. The bottom surface of the recess 8 is formed by the semiconductor layer 3. In this embodiment, the bottom surface of the recess 8 is an example of a "first region" in the present disclosure.

A first electrode 11 that makes Schottky contact with the bottom surface of the recess 8 is buried in the recess 8. In this embodiment, the first electrode 11 is buried in the entire space in the recess 8. The first electrode 11 is composed of a material that makes Schottky contact with the semiconductor layer 3, such as Ni, Pt, TiN, Mo, or Pb. In this embodiment, the first electrode 11 is formed of Ni. A high concentration region 3a having a high n-type impurity concentration is formed in a region where the recess 8 is not formed in the surface layer portion of the semiconductor layer 3. The concentration of n-type impurities in the high concentration region 3a is preferably $1 \times 10^{17}$ cm$^{-3}$ or more and $1 \times 10^{21}$ cm$^{-3}$ or less. The depth of the high concentration region 3a from the surface of the semiconductor layer 3 is preferably 0.1 μm or more and 0.5 μm or less.

A second electrode 12 that makes ohmic contact with the upper surface of the semiconductor layer 3 is formed in a surface region including the upper surface of the semiconductor layer 3, the upper surface of the first electrode 11, and the upper surface of the second gate insulating film 6B. The second electrode 12 may be formed to cover the upper surface of the semiconductor layer 3, the upper surface of the first electrode 11, and the upper surface of the second gate insulating film 6B in a region excluding one end portion in the Y direction among the surface regions including the upper surface of the semiconductor layer 3, the upper surface of the first electrode 11, and the upper surface of the second gate insulating film 6B. The second electrode 12 is in ohmic contact with the upper surface of the semiconductor layer 3 (the surface of the high concentration region 3a) and is in contact with the upper surface of the first electrode 11. That is, the second electrode 12 is electrically connected to the first electrode 11. Since the second electrode 12 is in ohmic contact with the surface of the high concentration region 3a, the contact resistance between the second electrode 12 and the semiconductor layer 3 can be reduced.

The second electrode 12 is composed of a material that makes ohmic contact with the semiconductor layer 3, such as a Ti film, a Ti/Au laminated film composed of a lower Ti film and an upper Au film, or the like. In this embodiment, the second electrode 12 is formed of a Ti film. A source electrode 10 is composed of the first electrode 11 and the second electrode 12. In this embodiment, among regions other than the recess 8 in the inter-region 7, a region in which the second electrode 12 is formed corresponds to a "second region" in the present disclosure.

Among the surface regions including the upper surface of the semiconductor layer 3, the upper surface of the first electrode 11, and the upper surface of the second gate insulating film 6B, a gate pad (not shown) to which all the gate electrodes 5 are electrically connected may be arranged above one end portion in the Y direction in which the second electrode 12 is not formed. A drain electrode 13 is formed on the second main surface 2b of the semiconductor substrate 2. The drain electrode 13 is composed of a material that makes ohmic contact with the semiconductor layer 3, such as a Ti film, a Ti/Au laminated film composed of a Ti film formed on the second main surface 2b and an Au film laminated on the Ti film, or the like. In this embodiment, the drain electrode 13 is formed of a Ti film.

In this semiconductor device 1, a depletion layer is formed in the region between the adjacent gate electrodes 5 in the semiconductor layer 6, and a current between the drain and source electrodes is controlled by expanding or contracting the width of the depletion layer by a gate voltage. When the semiconductor device 1 is used as a normally-off type transistor, for example, a predetermined voltage at which the drain electrode 13 side is positive is applied between the source electrode 10 and the drain electrode 13. In that state, an off voltage (0V) or an on voltage (predetermined positive voltage) is applied to the gate electrode 5 with the source electrode 10 as a reference potential (0V).

When the off voltage is applied to the gate electrode 5, a wide depletion layer in contact with the corresponding gate insulating film 6 on both sides in the X direction is formed in the region between the adjacent gate electrodes 5 in the semiconductor layer 6 (to be precise, the region between the gate insulating films 6 covering the adjacent gate electrodes 5). As a result, the transistor is turned off. When the on-voltage is applied to the gate electrode 5, the width of the depletion layer is narrowed, and both sides of the depletion layer in the X direction recede inward from the corresponding gate insulating film 6. As a result, the transistor is turned on.

A semiconductor device having almost the same configuration as the semiconductor device 1 and in which the source electrode 10 is composed of only the second electrode 12 that makes ohmic contact with the semiconductor layer 3 will be referred to as a comparative example. That is, in the comparative example, the first electrode 11 that makes Schottky contact with the semiconductor layer 3 is not provided. In the comparative example, if a high voltage is continuously applied between the drain-source electrodes, a withstand voltage reduction phenomenon such as a sudden current flowing between the drain-source electrodes may occur. The reason for this is that when a high voltage is applied between the drain-source electrodes, holes and electrons are generated in the semiconductor layer 3. The electrons generated in the semiconductor layer 3 flow to the drain electrode via the semiconductor layer 3. On the other hand, the holes generated in the semiconductor layer 3 move to the vicinity of the source electrode 10 (the second electrode 12) through the depletion layer in the semiconductor layer 3. However, since the source electrode 10 is in ohmic contact with the semiconductor layer 3, a barrier that hinders the movement of the holes from the n-type semiconductor layer 3 to the source electrode 10 exists at an interface between the source electrode 10 and the n-type semiconductor layer 3. As a result, the holes cannot move to the source electrode 10, so that the holes are accumulated in the semiconductor layer 3. As the holes are accumulated in the semiconductor layer 3, a barrier to electrons at the interface between the source electrode 10 and the semiconductor layer 3 becomes lower. As a result, the withstand voltage reduction phenomenon occurs in which a current suddenly flows between the drain and source electrodes.

In the above-described first embodiment, the source electrode 10 is composed of the first electrode 11 that makes a Schottky contact with a portion of the inter-region 7 of the adjacent gate electrodes 5 on the upper surface of the semiconductor layer 3, and the second electrode 12 that makes ohmic contact with another portion of the inter-region 7. Since the first electrode 11 is in Schottky contact with the portion of the inter-region 7, no barrier that hinders the movement of holes from the semiconductor layer 3 to the first electrode 11 exists at the interface between the first electrode 11 and the semiconductor layer 3.

As a result, the holes that have moved to the vicinity of the source electrode 10 move from the semiconductor layer 3 to the first electrode 11. That is, the holes that have moved to the vicinity of the source electrode 10 are taken out by the first electrode 11. As a result, it is possible to suppress the holes from being accumulated in the semiconductor layer 3, which makes it possible to suppress the occurrence of the withstand voltage reduction phenomenon in which a current suddenly flows between the drain and source electrodes when a transistor is turned off.

In the above-described first embodiment, the first electrode 11 is buried in the recess 8 formed on the surface of the semiconductor layer 3. As a result, a Schottky structure at the interface between the first electrode 11 and the semiconductor layer 3 can reach or approach the depletion layer in the semiconductor layer 3, so that the holes can be taken out more effectively by the first electrode 11. Hereinafter, the depth of the trench 4 and the depth position of the gate electrode 5 will be described.

Referring to FIG. 2, assuming that the film thickness of the semiconductor layer 3 is a and the depth of the high concentration region 3a from the surface of the semiconductor layer 3 is b, the depth c of the trench 4 needs to be larger than b and smaller than a. The depth c of the trench 4 is preferably $[b+\{(a-b)/4\}]<c<b+\{3(a-b)/4\}]$. Referring to FIG. 3, it is assumed that the depth from the surface of the semiconductor layer 3 to the upper surface of the gate electrode 5 is d, the depth from the surface of the semiconductor layer 3 to the lower surface of the first electrode 11 is e, and the depth from the surface of the semiconductor layer 3 to the lower surface of the gate electrode 5 is g.

In order for the Schottky structure at the interface between the first electrode 11 and the semiconductor layer 3 to reach or approach the depletion layer in the semiconductor layer 3, it is preferable that the depth e from the surface of the semiconductor layer 3 to the lower surface of the first electrode 11 satisfies a first condition represented by the following equation (1).

$$d<e<g \qquad (1)$$

It is assumed that the depth from the surface of the semiconductor layer 3 to the center of the gate electrode 5 in the vertical direction is f. In order to suppress the electric field concentration near the corner of the lower end of the gate insulating film 6 in the semiconductor layer 3 and the increase in capacitance between the gate electrode 5 and the first electrode 11, it is preferable that the depth e from the surface of the semiconductor layer 3 to the lower surface of the first electrode 11 satisfies a second condition represented by the following equation (2).

$$d<e<f \qquad (2)$$

Figure 4A:
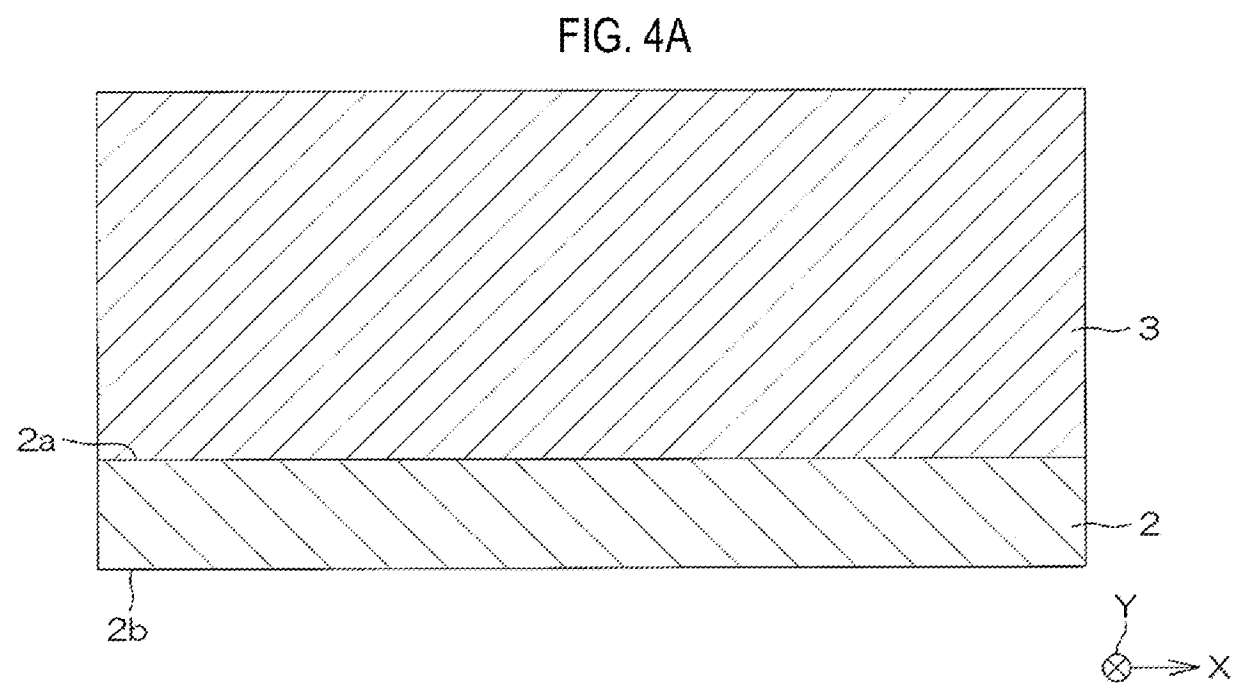
Figure 4B:
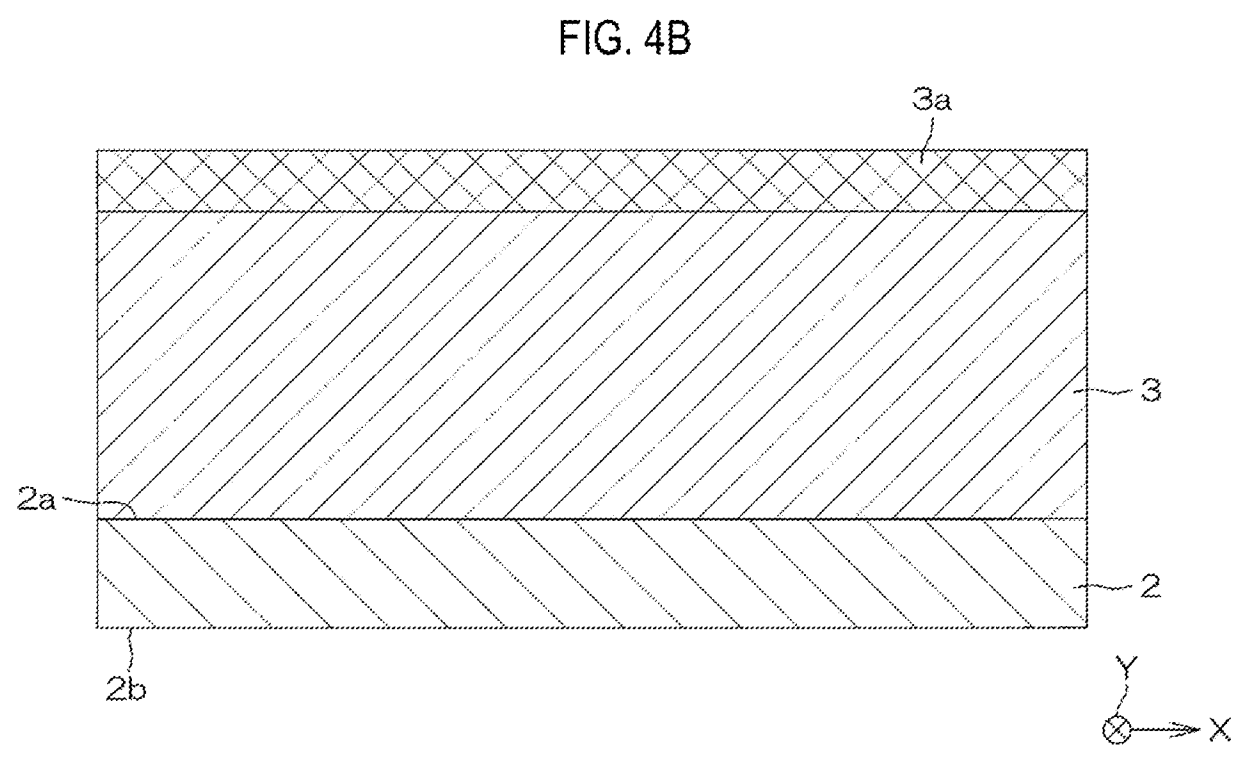
Figure 4C:
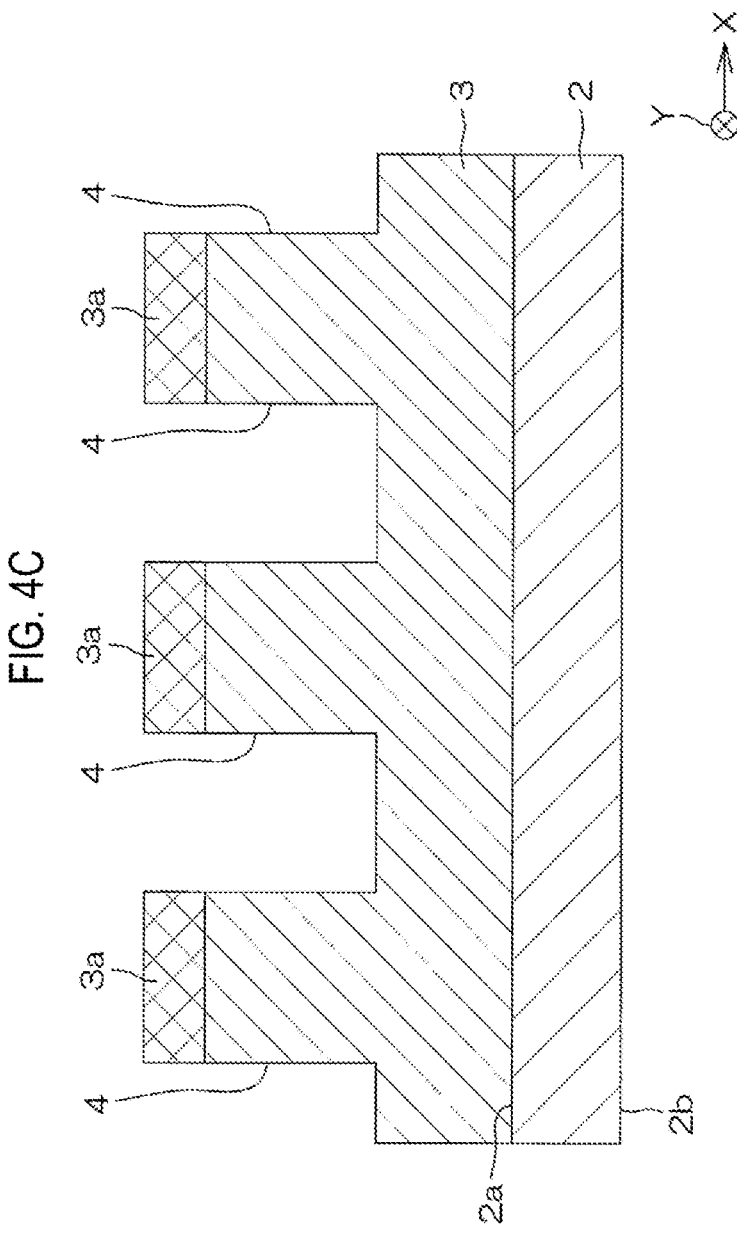
FIG. 4C is a cross-sectional view showing a next step of FIG. 4B.

That is, the depth e from the surface of the semiconductor layer 3 to the lower surface of the first electrode 11 preferably satisfies the first condition, more preferably the second condition. FIGS. 4A to 4F are cross-sectional views for explaining an example of a manufacturing method of the above-described semiconductor device 1, which correspond to the cut section of FIG. 2. FIGS. 5A and 5B are cross-sectional views for explaining an example of the manufacturing method of the above-described semiconductor device 1, which correspond to the cut section of FIG. 3.

First, as shown in FIG. 4A, for example, the n-type semiconductor layer 3 is epitaxially grown on the n-type semiconductor substrate 2 by an HVPE (Hydride Vapor Phase Epitaxy) method. The semiconductor substrate 2 is, for example, a Si substrate, and the semiconductor layer 3 is, for example, a $Ga_2O_3$ layer. The semiconductor layer 3 may be formed on the semiconductor substrate 2 by an MOCVD (Metal Organic Chemical Vapor Deposition) method, an MBE (Molecular Beam Epitaxy) method, or the like.

Next, as shown in FIG. 4B, n-type impurities are injected into the entire surface layer portion of the semiconductor layer 3. Then, an activation annealing process is performed.

The temperature of the activation annealing process is preferably 800 degrees C. or higher, more preferably 900 degrees C. or higher and 1,000 degrees C. or lower. As a result, the high concentration region 3a having a high n-type impurity concentration is formed over the entire surface layer portion of the semiconductor layer 3. Next, as shown in FIG. 4C, a plurality of trenches 4 are formed on the surface of the semiconductor layer 3 by photolithography and dry etching by an MOCVD method. As an etching gas, for example, $Cl_2$, $BCl_3$, or the like is used.

Figure 4D:
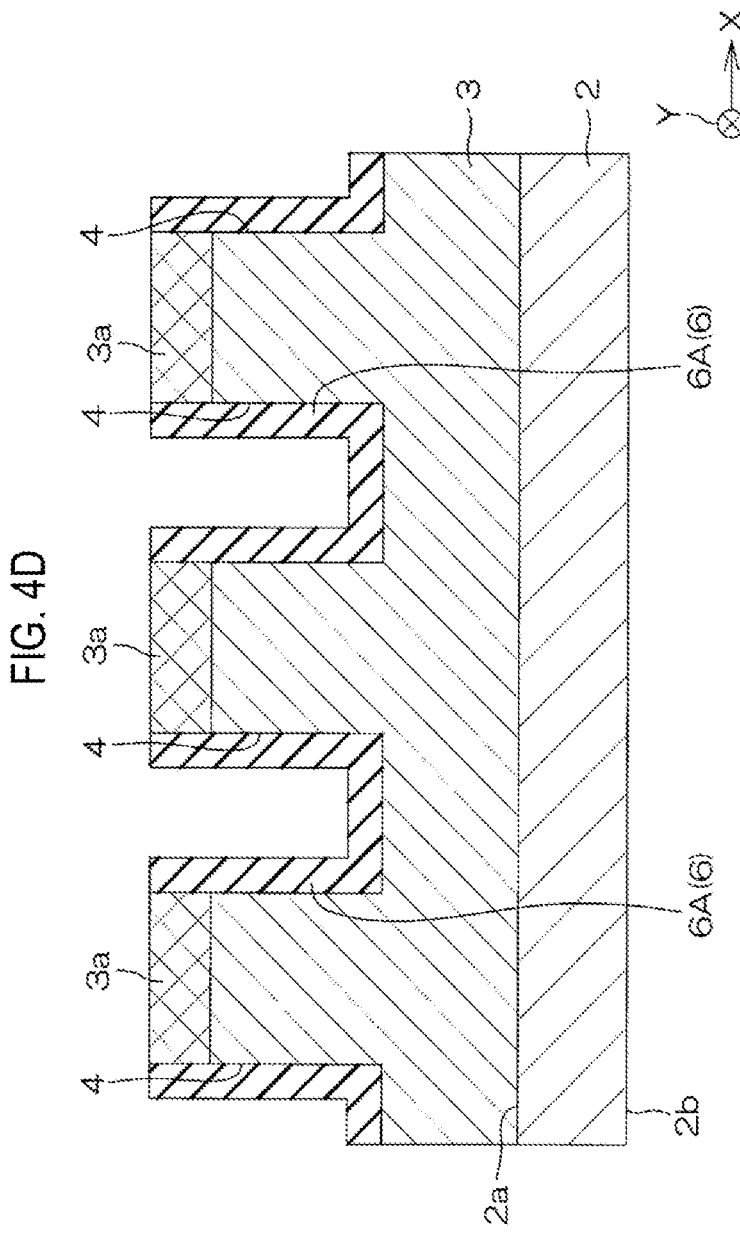
FIG. 4D is a cross-sectional view showing a next step of FIG. 4C.
Figure 5A:
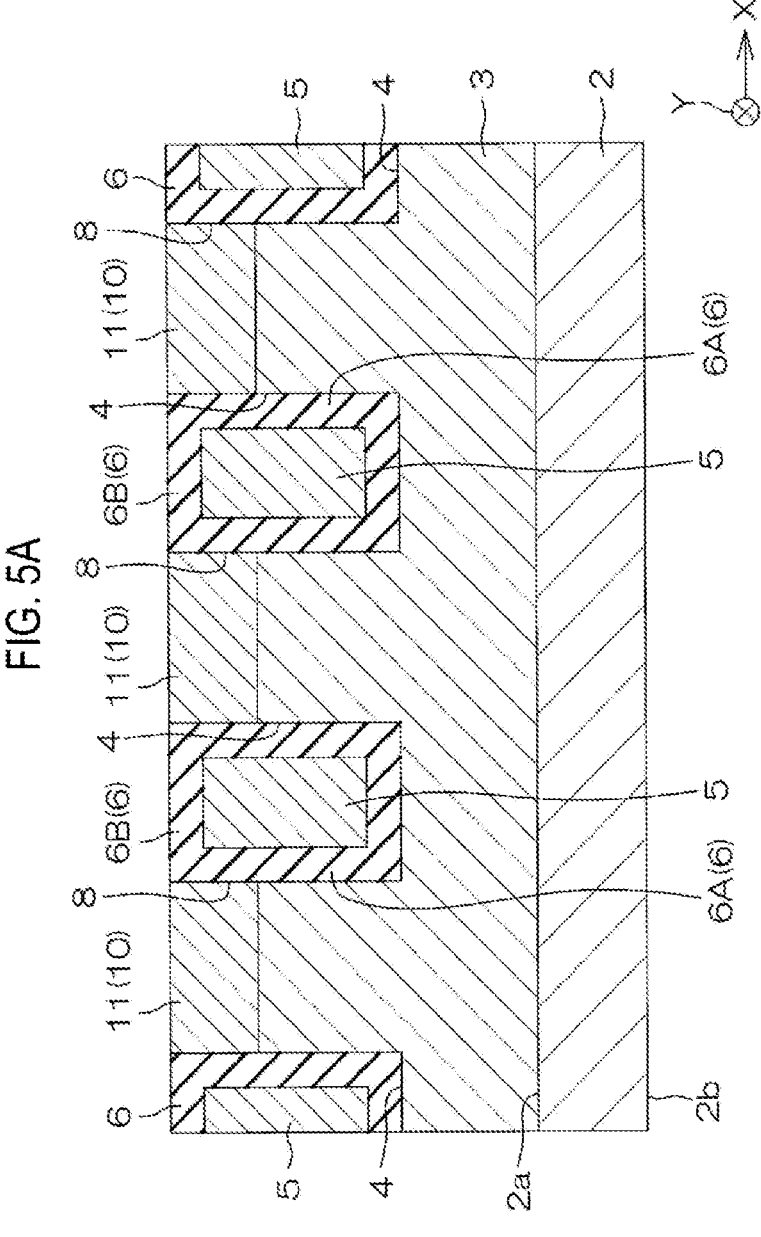
FIG. 5A is a cross-sectional view showing an example of the manufacturing process of the nitride semiconductor device of FIG. 1, which corresponds to the cut section of FIG. 3.
Figure 5B:
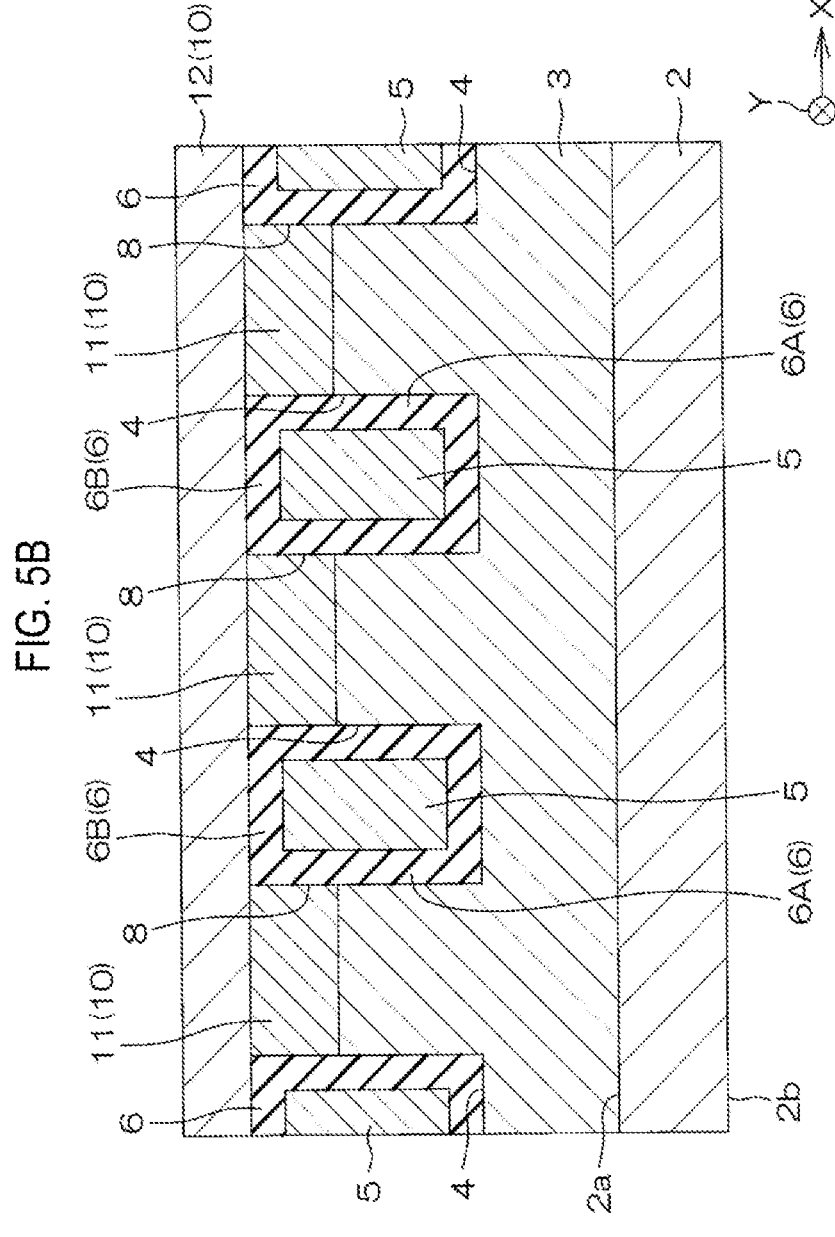
FIG. 5B is a cross-sectional view showing a next step of FIG. 5A.

Next, as shown in FIG. 4D, the first gate insulating film 6A is formed on the side surface and the bottom surface of each trench 4 by, for example, an ALD (Atomic Layer Deposition) method. The first gate insulating film 6A is formed of, for example, an $Al_2O_3$ film. When the ALD method is used, precursors are TMA (trimethylaluminum) and $H_2O$. The formation of the first gate insulating film 6A on the side surface and the bottom surface of the trench 4 may be performed by forming a resist that covers a portion of the entire surface other than the portion corresponding to the trench 4 and forming an insulating material film, which is a material film of the first gate insulating film 6A, on the inner surface of the trench 4 using a resist as a mask. Further, the insulating material film which is the material film of the first gate insulating film 6A may be formed on the entire surface, and then the insulating material film may be patterned by dry etching. Instead of the ALD method, a PCVD (Plasma Enhanced Chemical Vapor Deposition) method or a sputtering method may be used.

Figure 4E:
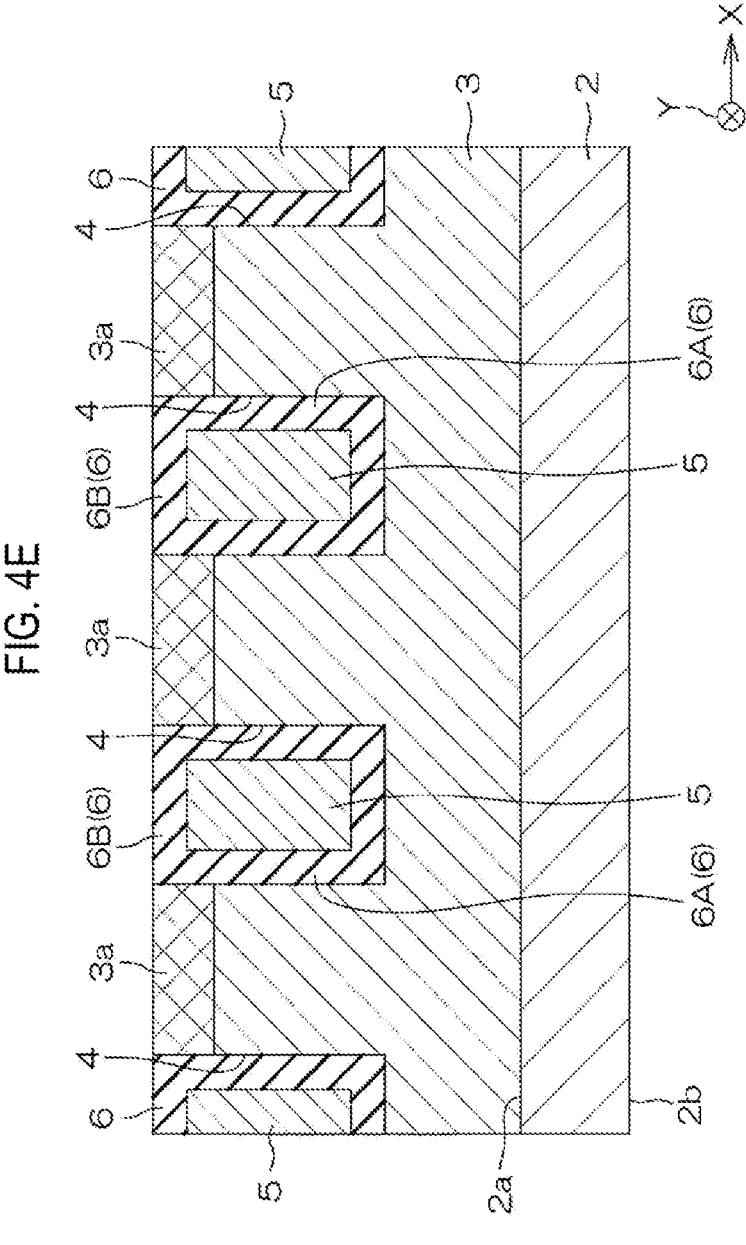
FIG. 4E is a cross-sectional view showing a next step of FIG. 4D.

Next, as shown in FIG. 4E, the material of the gate electrode 5 is buried in a space surrounded by the first gate insulating film 6A in the trench 4. The material of the gate electrode 5 is, for example, polysilicon. As a result, the gate electrode 5 is formed. Then, the second gate insulating film 6B that covers the upper surface of the gate electrode 5 is formed. As a result, the gate insulating film 6 that covers the side surface, the bottom surface, and the upper surface of the gate electrode 5 is formed.

Next, as shown in FIG. 5A, the recess 8 is formed on the surface of the semiconductor layer 3 by photolithography and dry etching. As an etching gas, for example, $Cl_2$, $BCl_3$, or the like is used. Then, the first electrode 11 that makes Schottky contact with the bottom surface of the recess 8 is buried in the recess 8 by, for example, a sputtering method. The first electrode 11 is formed of, for example, Ni.

Figure 4F:
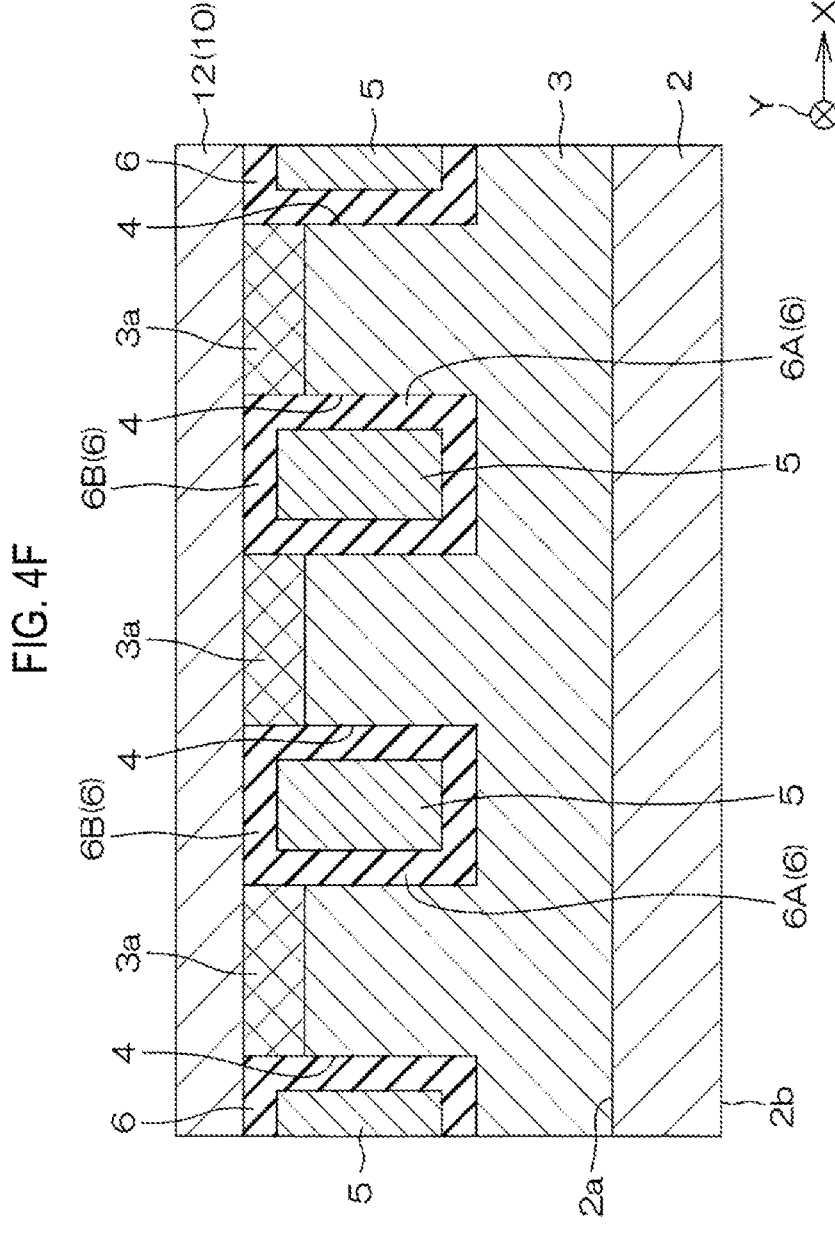
FIG. 4F is a cross-sectional view showing a next step of FIG. 4E.

Next, as shown in FIGS. 4F and 5B, for example, the second electrode 12 that is in contact with the first electrode 11 and ohmic contact with the semiconductor layer 3 is formed in in a region excluding one end portion in the Y direction among the surface regions including the upper surface of the semiconductor layer 3, the upper surface of the first electrode 11, and the upper surface of the second gate insulating film 6B, by a sputtering method. The second electrode 12 is formed of, for example, Ti. Finally, the drain electrode 13 is formed on the second main surface 2b of the semiconductor substrate 2. The drain electrode 13 is formed of, for example, Ti. As a result, the semiconductor device 1 as shown in FIGS. 1 to 3 is obtained.

Figure 6:
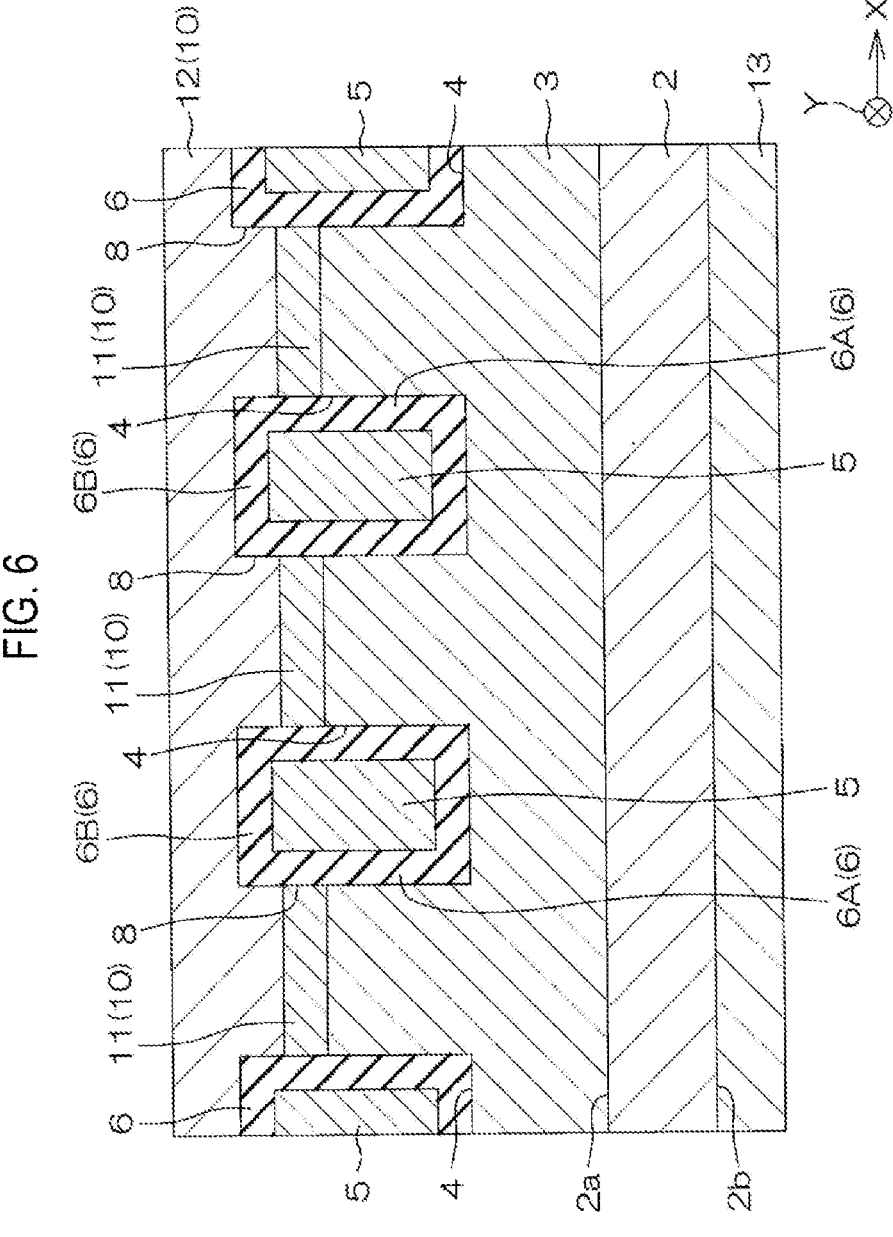
FIG. 6 is a cross-sectional view showing a modification of the first embodiment, which corresponds to the cut section of FIG. 3.

FIG. 6 is a cross-sectional view for explaining a modification of the first embodiment, which corresponds to the cut section of FIG. 3. As shown in FIG. 6, the first electrode 11 may be in Schottky contact with the bottom surface of the recess 8 and may not be buried in the entire space in the recess 8. In FIG. 6, the first electrode 11 is buried in substantially the lower half of the recess 8. In this modification, a portion of the second electrode 12 enters a space remaining in the recess 8 after the first electrode 11 is buried in the recess 8, and is in contact with the first electrode 11.

Figure 7:
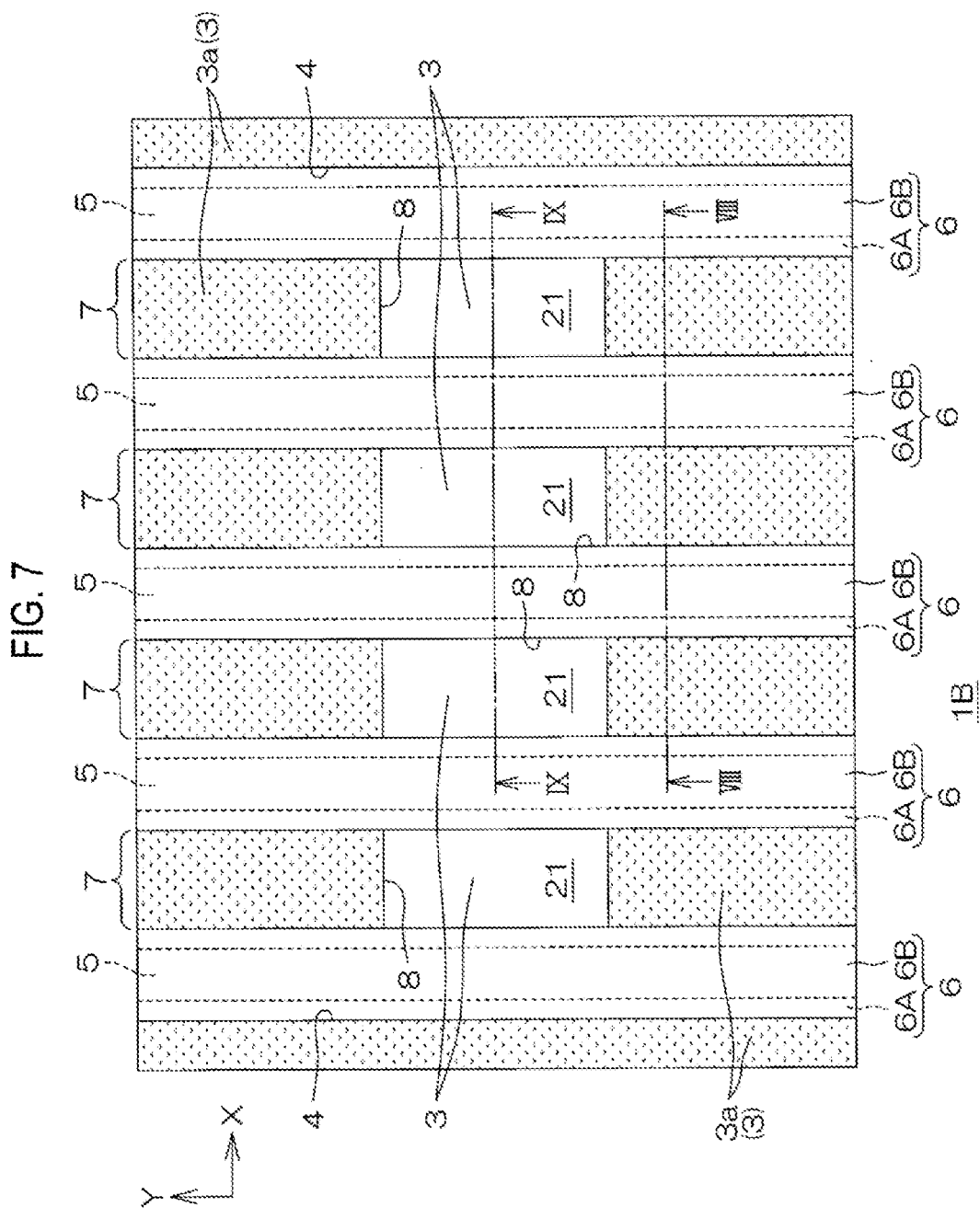
FIG. 7 is a schematic plan view of a semiconductor device according to a second embodiment of the present disclosure.
Figure 8:
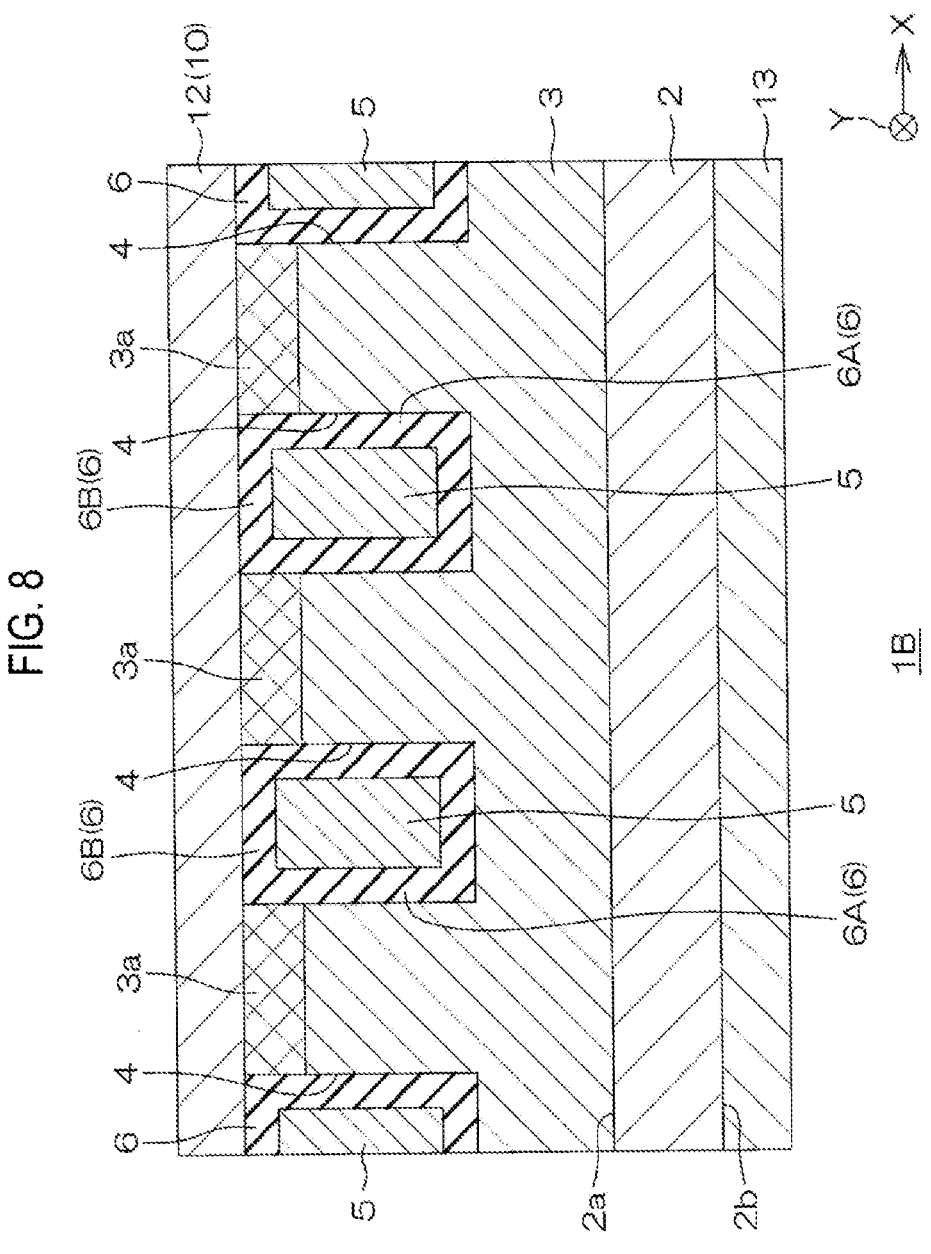
FIG. 8 is a cross-sectional view taken along line VIII-VIII of FIG. 7.
Figure 9:
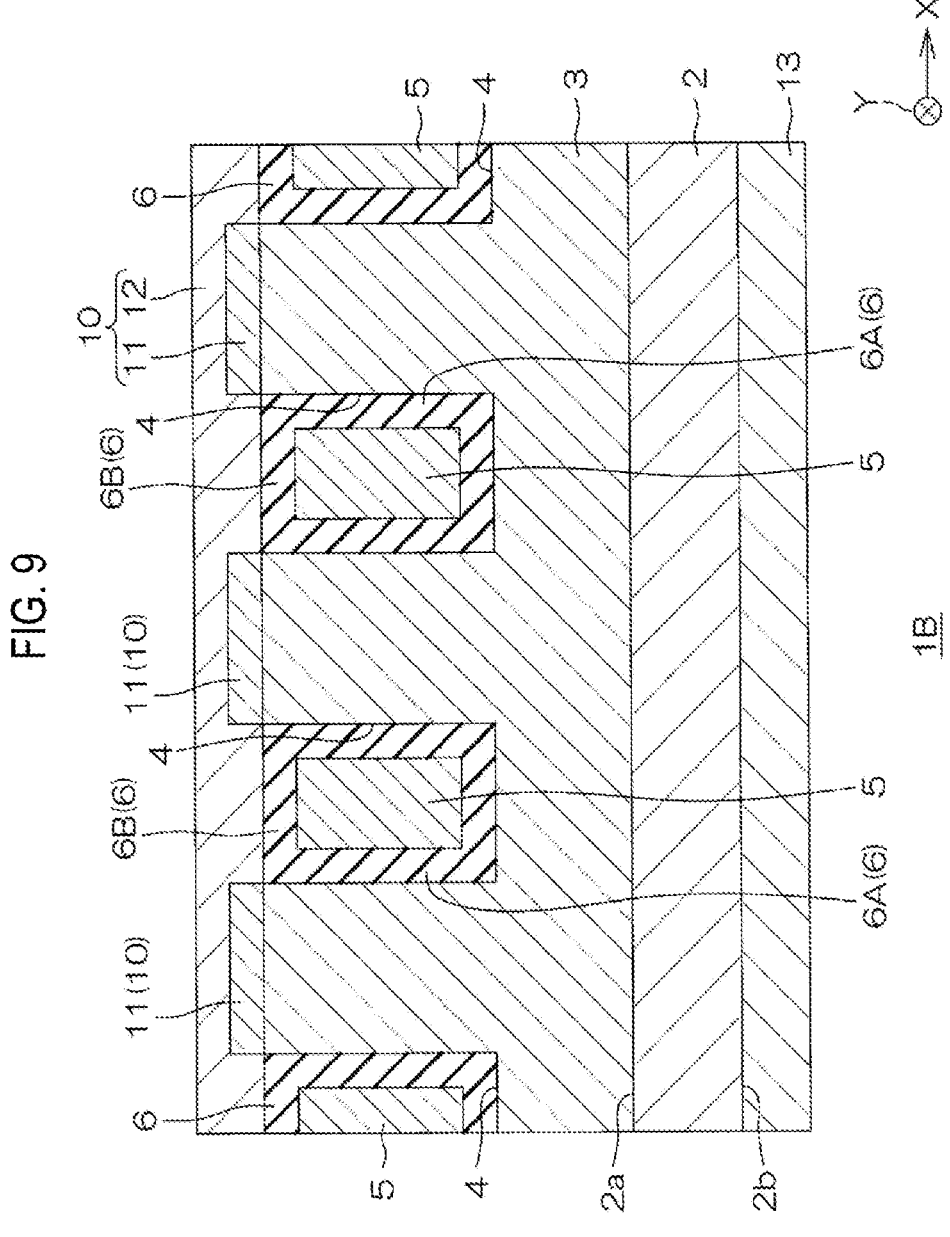
FIG. 9 is a cross-sectional view taken along line IX-IX of FIG. 7.

FIG. 7 is a schematic plan view of a semiconductor device according to a second embodiment of the present disclosure. FIG. 8 is a cross-sectional view taken along line VIII-VIII of FIG. 7. FIG. 9 is a cross-sectional view taken along line IX-IX of FIG. 7. In FIG. 7, the configuration above the surface of the semiconductor layer 3 is omitted. In FIGS. 7, 8, and 9, the portions corresponding to the parts of FIGS. 1, 2, and 3 described above are denoted by the same reference numerals as those in FIGS. 1, 2, and 3, and the recess 8 is not formed in a semiconductor device 1A according to the second embodiment. Therefore, the first electrode 11 is not buried in the recess 8 but is formed on the surface of the semiconductor layer 3. The first electrode 11 is in Schottky contact with the surface of the semiconductor layer 3.

Specifically, the first electrode 11 is arranged in a first electrode forming region 21 which is a portion of the region between the adjacent gate electrodes 5 on the upper surface of the semiconductor layer 3 (more precisely, the region 7 between the gate insulating films 6 covering the adjacent gate electrodes 5). The first electrode 11 is in Schottky contact with the first electrode forming region 21. In this embodiment, the first electrode forming region 21 is formed in the length intermediate portion (intermediate portion in the Y-direction) of the inter-region 7. The width (length in the X direction) of the first electrode forming region 21 is equal to the width of the inter-region 7. The first electrode 11 is composed of a material that makes Schottky contact with the semiconductor layer 3, such as Ni, Pt, TiN, Mo, or Pb. In this embodiment, the first electrode 11 is formed of Ni. The first electrode forming region 21 is an example of a "first region" in the present disclosure.

The high concentration region 3a having a high n-type impurity concentration is formed in a region other than the first region 21 on the surface of the semiconductor layer 3. The concentration of n-type impurities in the high concentration region 3a is preferably $1 \times 10^{17}$ cm$^{-3}$ or more and $1 \times 10^{21}$ cm$^{-3}$ or less. The depth of the high concentration region 3a from the surface of the semiconductor layer 3 is preferably 0.1 μm or more and 0.5 μm or less. The second electrode 12 is formed on a surface region including the upper surface of the semiconductor layer 3, the upper surface of the first electrode 11, and the upper surface of second gate insulating film 6B. The second electrode 12 may be formed so as to cover the upper surface of the semiconductor layer 3, the upper surface of the first electrode 11, and the upper surface of the second gate insulating film 6B in a region excluding one end portion in the Y direction among the surface regions including the upper surface of the semiconductor layer 3, the upper surface of the first electrode 11, and the upper surface of the second gate insulating film 6B. The second electrode 12 is in ohmic contact with the upper surface of the semiconductor layer 3 and is in contact with the upper surface and the side surface of the first electrode 11. That is, the second electrode 12 is electrically connected to the first electrode 11. Among the regions other than the first electrode forming region 21 in the inter-region 7, a region in which the second electrode 12 is formed corresponds to a "second region" in the present disclosure.

The second electrode 12 is composed of a material that makes ohmic contact with the semiconductor layer 3, such as a Ti film, a Ti/Au laminated film composed of a lower Ti film and an upper Au film, or the like. In this embodiment, the second electrode 12 is formed of a Ti film. The source electrode 10 is composed of the first electrode 11 and the second electrode 12. Among the surface regions including the upper surface of the semiconductor layer 3, the upper surface of the first electrode 11, and the upper surface of the second gate insulating film 6B, a gate pad (not shown) to which all the gate electrodes 5 are electrically connected may be arranged above one end portion in the Y direction in which the second electrode 12 is not formed.

Also in this embodiment, since no barrier that hinders the movement of holes from the semiconductor layer 3 to the first electrode 11 exists at the interface between the first electrode 11 and the semiconductor layer 3, the holes that have moved to the source electrode 10 side when the transistor is turned off can be taken out by the first electrode 11. As a result, it is possible to suppress the holes from being accumulated in the semiconductor layer 3, which makes it possible to suppress the occurrence of a withstand voltage reduction phenomenon in which a current suddenly flows between the drain and source electrodes when the transistor is turned off.

A manufacturing process of the semiconductor device 1A according to the second embodiment is similar to the manufacturing process of the semiconductor device 1 according to the first embodiment. However, in the step shown in FIG. 4B described above, the high concentration region 3a is formed in a region other than the first electrode forming region 21 of the surface of the semiconductor layer 3. Further, in the step shown in FIG. 5A described above, the first electrode 11 is formed on the first electrode forming region 21 in the surface of the semiconductor layer 3 without forming the recess 8. Further, in the steps shown in FIGS. 4G and 5B described above, the second electrode 12 is formed to cover the upper surface of the semiconductor layer 3, the upper surface and the side surface of the first electrode 11, and the upper surface of the second gate insulating film 6B in a region excluding one end portion in the Y direction in the surface region including the upper surface of the semiconductor layer 3, the upper surface of the first electrode 11, and the upper surface of the second gate insulating film 6B.

Figure 10:
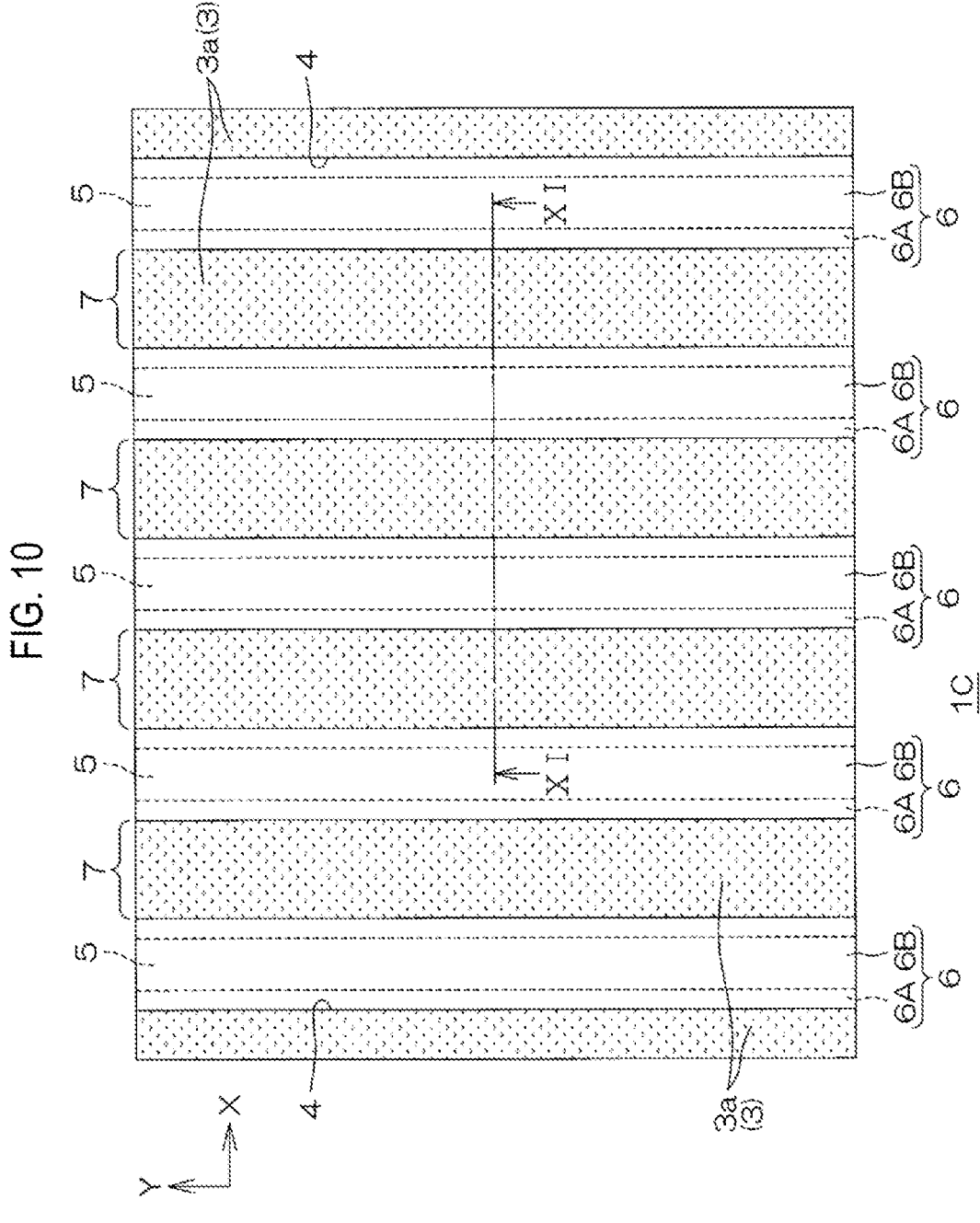
FIG. 10 is a schematic plan view of a semiconductor device according to a third embodiment of the present disclosure.
Figure 11:
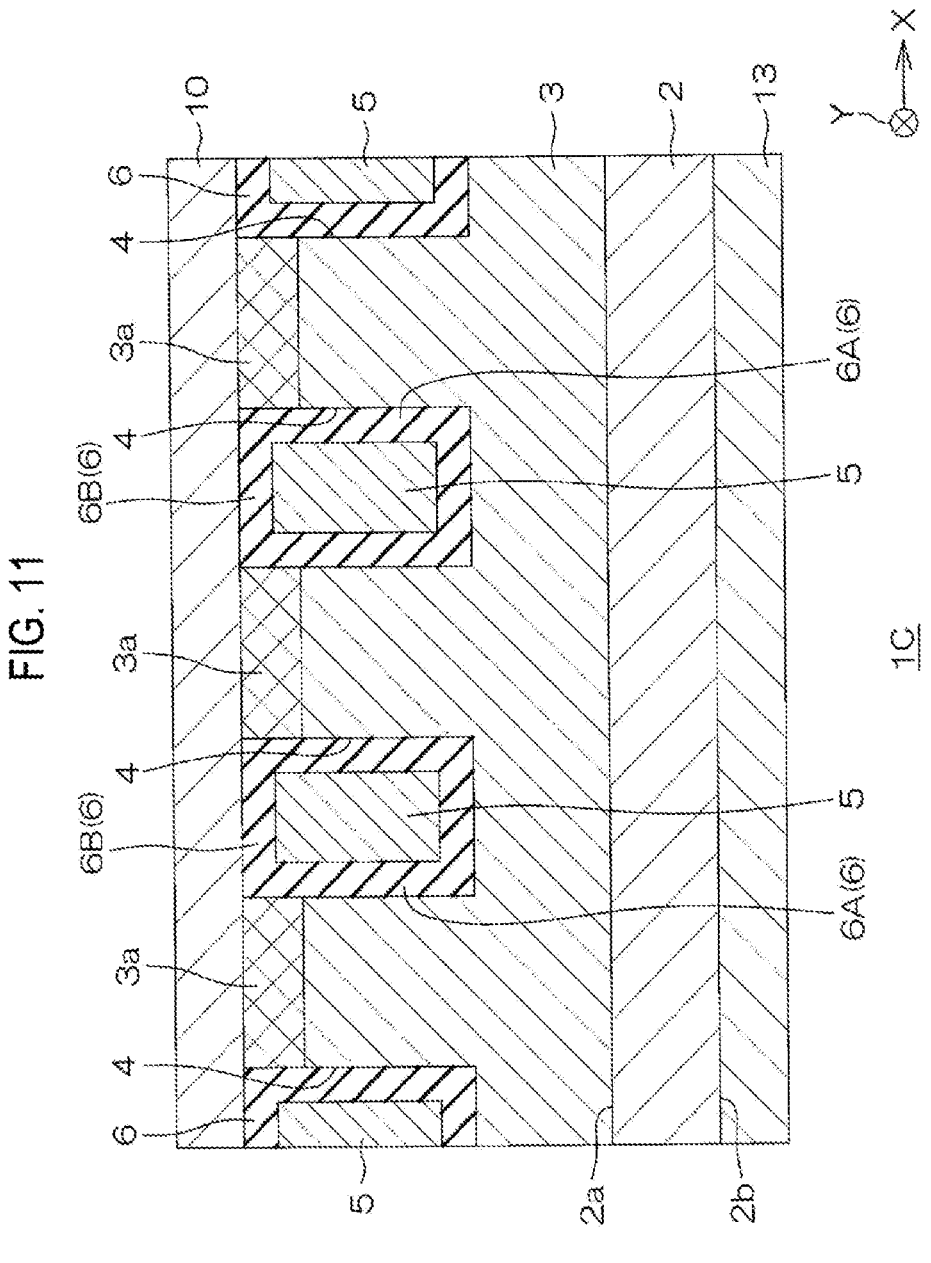
FIG. 11 is a cross-sectional view taken along line XI-XI of FIG. 10.

FIG. 10 is a schematic plan view of a semiconductor device according to a third embodiment of the present disclosure. FIG. 11 is a cross-sectional view taken along line XI-XI of FIG. 10. In FIG. 10, the configuration above the surface of the semiconductor layer 3 is omitted. In FIGS. 10 and 11, the portions corresponding to the parts of FIGS. 1 and 2 are denoted by the same reference numerals as those of FIGS. 1 and 2. In the semiconductor device 1B according to the third embodiment, as in the semiconductor device 1 according to the first embodiment, the first electrode 11 that makes Schottky contact with the surface of the semiconductor layer 3 is not provided. Further, the semiconductor device 1B according to the third embodiment is characterized by the materials of the gate electrode 5 and the gate insulating film 6.

In the semiconductor device 1B according to the third embodiment, the high concentration region 3a having a high n-type impurity concentration is formed over the entire surface of the semiconductor layer 3. The source electrode 10 that makes ohmic contact with the upper surface of the semiconductor layer 3 (the surface of the high concentration region 3a) is formed in a surface region including the upper surface of the semiconductor layer 3 and the upper surface of the second gate insulating film 6B. The source electrode 10 may be formed to cover the upper surface of the semiconductor layer 3 and the upper surface of the second gate insulating film 6B in a region excluding one end portion in the Y direction among the surface regions including the upper surface of the semiconductor layer 3 and the upper surface of the second gate insulating film 6B. The source electrode 10 is composed of a material that makes ohmic contact with the semiconductor layer 3, such as a Ti film, a Ti/Au laminated film composed of a lower Ti film and an upper Au film, or the like. In this embodiment, the source electrode 10 is formed of a Ti film.

Among the surface regions including the upper surface of the semiconductor layer 3 and the upper surface of the second gate insulating film 6B, a gate pad (not shown) to which all the gate electrodes 5 are electrically connected may be arranged above one end portion in the Y direction in which the second electrode 12 is not formed. In the semi-conductor device 1B according to the third embodiment, the gate electrode 5 is formed of n-type polysilicon. The gate insulating film 6 (the first gate insulating film 6A and the second gate insulating film 6B) is formed of an AlN film or a SiN film.

Further, similarly to the semiconductor device 1 accord-ing to the third embodiment, the semiconductor layer 3 is formed of an oxide semiconductor such as $Ga_2O_3$ or ZnO. In the third embodiment, the semiconductor layer 3 is formed of a $Ga_2O_3$ layer. $Al_2O_3$ or $SiO_2$ is generally used as the material of the gate insulating film 6. When the gate insu-lating film 6 is composed of $Al_2O_3$ or $SiO_2$, a barrier that hinders the movement of holes from the semiconductor layer 3 to the gate insulating film 6 exists at an interface between the semiconductor layer 3 and the gate insulating film 6. Therefore, the holes generated in the semiconductor layer 3 when the transistor is turned off cannot be released to the gate electrode 5 via the gate insulating film 6.

In the third embodiment, since the gate insulating film 6 is composed of an AlN film or a SiN film, no barrier that hinders the movement of holes from the semiconductor layer 3 to the gate insulating film 6 exists at the interface between the semiconductor layer 3 and the gate insulating film 6. Therefore, the holes generated in the semiconductor layer 3 when the transistor is turned off can be released to the gate electrode 5 via the gate insulating film 6. However, if a p-type semiconductor or metal is used as the material of the gate electrode 5, the holes will flow from the gate electrode 5 into the semiconductor layer 3 when an on-voltage is applied to the gate electrode 5. In the third embodiment, since the gate electrode 5 is composed of n-type polysilicon, it is possible to prevent the holes from flowing from the gate electrode 5 into the semiconductor layer 3 when the on-voltage is applied to the gate electrode 5.

Figure 12A:
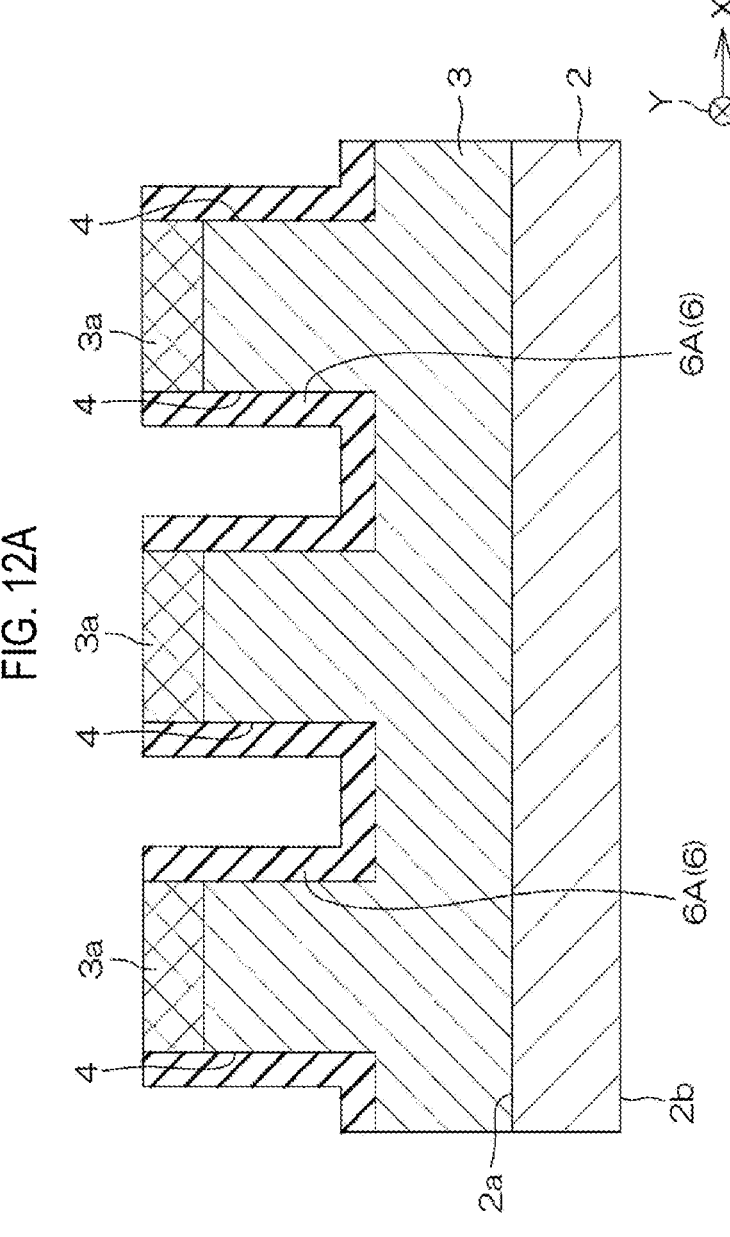
FIG. 12A is a cross-sectional view showing an example of a manufacturing process of the nitride semiconductor device of FIG. 10, which corresponds to the cut surface of FIG. 11.
Figure 12B:
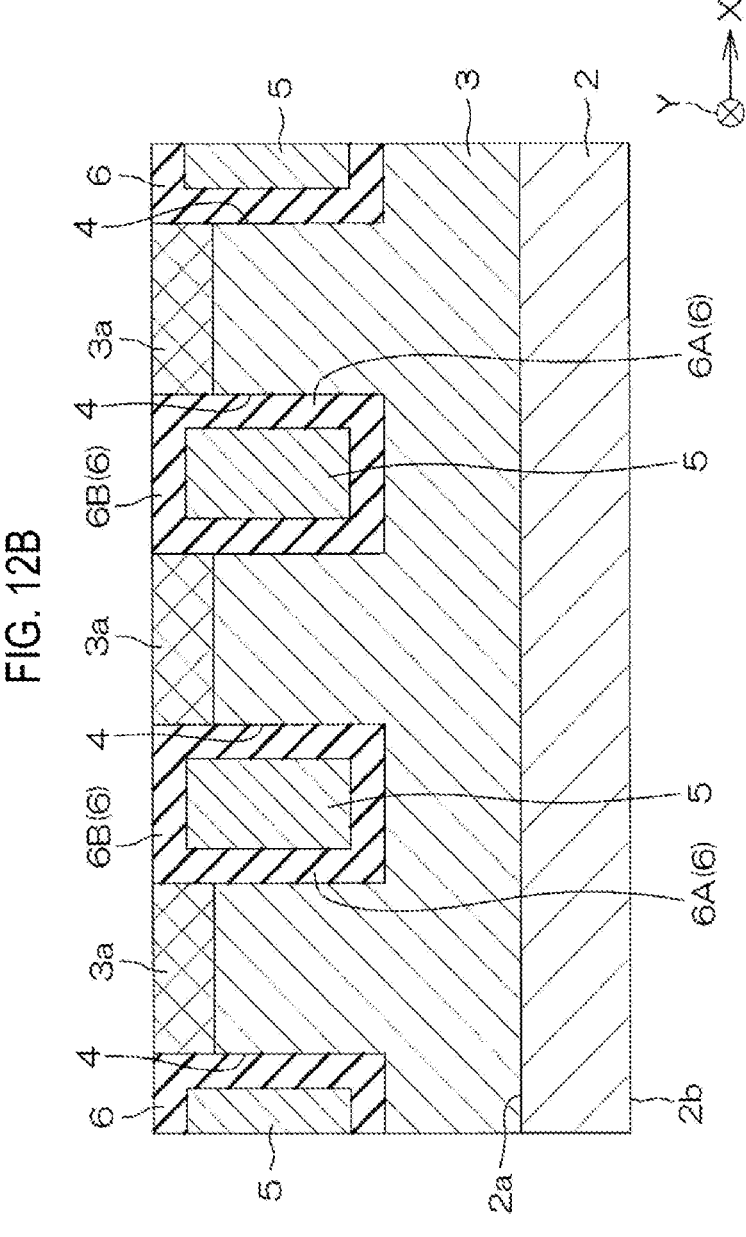
FIG. 12B is a cross-sectional view showing a next step of FIG. 12A.
Figure 12C:
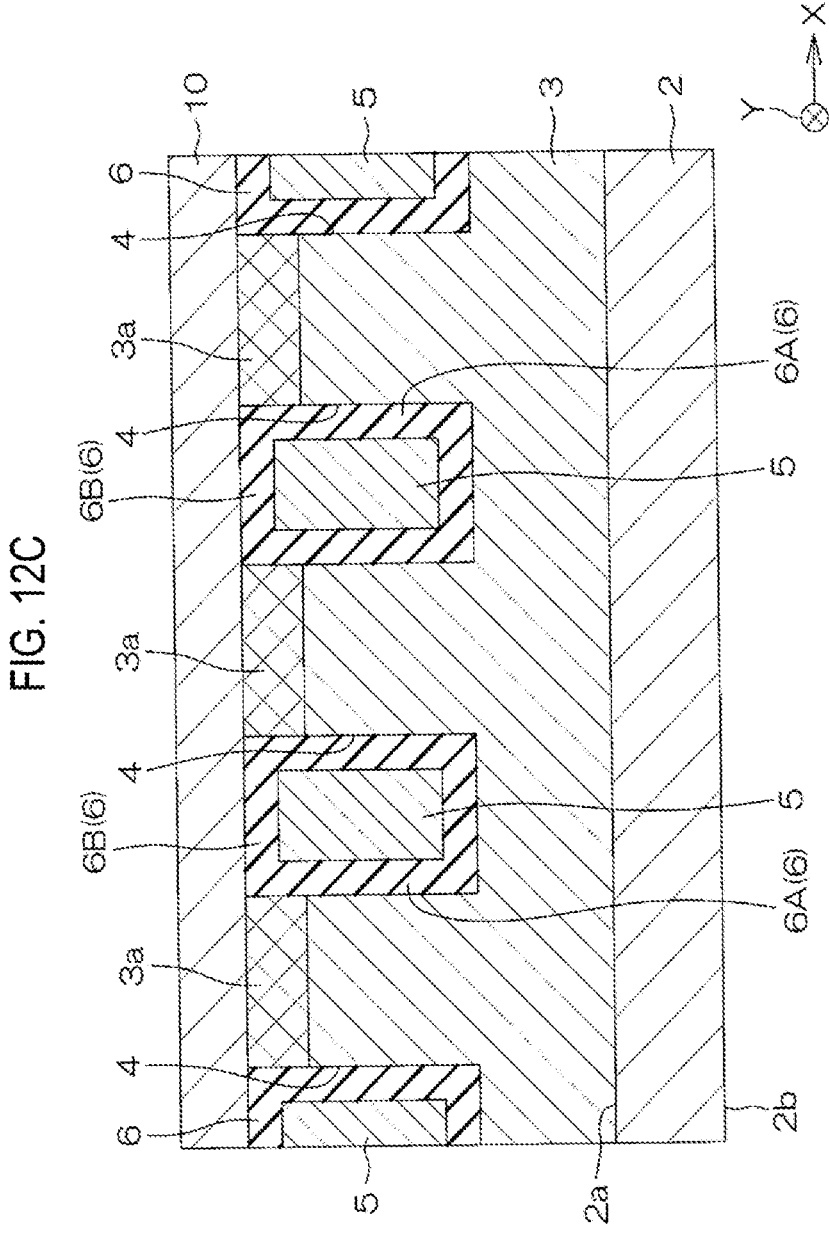
FIG. 12C is a cross-sectional view showing a next step of FIG. 12B.

That is, in the third embodiment, the holes generated in the semiconductor layer 3 when the transistor is turned off can be released to the gate electrode 5 via the gate insulating film 6. As a result, it is possible to suppress the holes from being accumulated in the semiconductor layer 3, which makes it possible to suppress the occurrence of a withstand voltage reduction phenomenon in which a current suddenly flows between the drain and source electrodes when the transistor is turned off. FIGS. 12A to 12C are cross-sectional views for explaining an example of a method of manufac-turing the above-described semiconductor device 1B, which correspond to the cut section of FIG. 11.

Also in the case of manufacturing the semiconductor device 1B, the same steps as those in FIGS. 4A to 4C described above are performed. In this case, the cross-sectional views of FIGS. 4A to 4C can be regarded as the cross-sectional views corresponding to the cut section of FIG. 11. When the trench 4 is formed by the step of FIG. 4C, as shown in FIG. 12A, for example, the first gate insulating film 6A is formed on the side surface and the bottom surface of the trench 4 by an ALD method. The first gate insulating film 6A is composed of an AlN film or a SiN film. Instead of the ALD method, a PCVD method or a sputtering method may be used.

Next, as shown in FIG. 12B, the material of the gate electrode 5 is buried in a space surrounded by the first gate insulating film 6A in the trench 4. The material of the gate electrode 5 is n-type polysilicon. As a result, the gate electrode 5 is formed. Then, the second gate insulating film 6B that covers the upper surface of the gate electrode 5 is formed. The second gate insulating film 6B is formed of the same material as the first gate insulating film 6A. As a result, the gate insulating film 6 that covers the side surface, the bottom surface, and the upper surface of the gate electrode 5 is formed.

Next, as shown in FIG. 12C, the second electrode 12 is formed in a region excluding one end portion in the Y direction in a surface region including the upper surface of the semiconductor layer 3 and the upper surface of the second gate insulating film 6B by, for example, a sputtering method. The second electrode 12 is formed of, for example, Ti. Finally, the drain electrode 13 is formed on the second main surface 2b of the semiconductor substrate 2. The drain electrode 13 is formed of, for example, Ti. As a result, the semiconductor device 1B as shown in FIGS. 10 and 11 is obtained.

Although the first to third embodiments of the present disclosure have been described above, the present disclosure can also be implemented in other embodiments. For example, in the above-described first to third embodiments, the high concentration region 3a having a high n-type impurity concentration is formed in a partial region or the entire region of the surface layer portion of the semicon-ductor layer 3, but the high concentration region 3a may not be formed.

Although the embodiments of the present disclosure have been described in detail, these are merely specific examples used to clarify the technical contents of the present disclo-sure, and the present disclosure should not be construed as being limited to these specific examples, but the scope of the present disclosure is limited only by the attached claims.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifica-tions as would fall within the scope and spirit of the disclosures.

What is claimed is:

1. A semiconductor device comprising:
   an n-type semiconductor substrate having a first main surface and a second main surface on an opposite side of the first main surface;
   an n-type semiconductor layer arranged on the first main surface of the semiconductor substrate;
   a pair of trenches formed at a distance from each other on a surface of the semiconductor layer on an opposite side of the semiconductor substrate;
   a pair of gate electrodes buried in the pair of trenches;
   a gate insulating film interposed between the gate elec-trodes and the semiconductor layer;
   a source electrode formed on the surface of the semicon-ductor layer on the opposite side of the semiconductor substrate; and a drain electrode formed on the second main surface of the semiconductor substrate, wherein the source electrode includes:

a first electrode that makes Schottky contact with a first region, which is a portion of an inter region of the pair of gate electrodes in the surface of the semiconductor layer, and a second electrode that makes ohmic contact with a second region different from the first region in the inter region, wherein a material composing the first electrode is different from a material composing the second electrode, and wherein a bottom surface of the first electrode makes contact with the surface of the semiconductor layer, a bottom surface of the second electrode makes contact with the surface of the semiconductor layer, and the bottom surface of the first electrode is flush with the bottom surface of the second electrode.

2. The semiconductor device of claim 1, wherein a high concentration region having a higher n-type impurity concentration than an n-type impurity concentration in other regions of the semiconductor layer is formed on a surface layer portion of the semiconductor layer immediately below the second electrode.

3. The semiconductor device of claim 2, wherein the n-type impurity concentration in the high concentration region is $1{\times}10^{17}$ cm$^{-3}$ to $1{\times}10^{21}$ cm$^{-3}$, and the n-type impurity concentration in regions other than the high concentration region in the semiconductor layer is $1{\times}10^{15}$ cm$^{-3}$ to $1{\times}10^{18}$ cm$^{-3}$.

4. The semiconductor device of claim 1, wherein the second electrode is composed of a laminated film of a Ti film formed on the semiconductor layer and an Au film formed on the Ti film, or a Ti single film.

5. The semiconductor device of claim 1, wherein the first electrode is composed of a Ni film, a Pt film, a TiN film, a Mo film, or a Pb film.

6. The semiconductor device of claim 1, wherein the semiconductor substrate is a Si substrate, a SiC substrate, a GaN substrate, or a Ga$_2$O$_3$ substrate.

7. The semiconductor device of claim 1, wherein the semiconductor layer is a Ga$_2$O$_3$ layer or a ZnO layer.

8. A method of manufacturing a semiconductor device, comprising:

forming an n-type semiconductor layer on an n-type semiconductor substrate;

forming a pair of trenches at a distance from each other on a surface of the semiconductor layer on an opposite side of the semiconductor substrate;

burying a pair of gate electrodes in the pair of trenches via a gate insulating film;

forming a source electrode on the surface of the semiconductor layer on the opposite side of the semiconductor substrate; and forming a drain electrode on a main surface of the semiconductor substrate, wherein the forming the source electrode includes:

forming a first electrode that makes Schottky contact with a first region, which is a portion of an inter region of the pair of gate electrodes in the surface of the semiconductor layer; and forming a second electrode that makes ohmic contact with a second region different from the first region in the inter region, wherein a material composing the first electrode is different from a material composing the second electrode, and wherein a bottom surface of the first electrode makes contact with the surface of the semiconductor layer, a bottom surface of the second electrode makes contact with the surface of the semiconductor layer, and the bottom surface of the first electrode is flush with the bottom surface of the second electrode.

* * * * *